(12) United States Patent
Takahashi

(10) Patent No.: US 9,018,676 B2
(45) Date of Patent: Apr. 28, 2015

(54) SEMICONDUCTOR DEVICE

(71) Applicant: Fujitsu Limited, Kawasaki-shi, Kanagawa (JP)

(72) Inventor: Tsuyoshi Takahashi, Ebina (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/971,980

(22) Filed: Aug. 21, 2013

(65) Prior Publication Data
US 2014/0070275 A1 Mar. 13, 2014

(30) Foreign Application Priority Data

Sep. 10, 2012 (JP) ................................. 2012-198509

(51) Int. Cl.
| | |
|---|---|
| H01L 29/861 | (2006.01) |
| H01L 29/12 | (2006.01) |
| H01L 29/66 | (2006.01) |
| H01L 27/14 | (2006.01) |
| H01L 51/05 | (2006.01) |
| H01L 31/08 | (2006.01) |
| H01L 31/00 | (2006.01) |
| H01L 31/0304 | (2006.01) |

(52) U.S. Cl.
CPC ............ *H01L 29/8613* (2013.01); *H01L 29/12* (2013.01); *H01L 29/6603* (2013.01); *H01L 29/861* (2013.01); *H01L 27/14* (2013.01); *H01L 51/0575* (2013.01); *H01L 31/085* (2013.01); *H01L 31/00* (2013.01); *H01L 31/03046* (2013.01)

(58) Field of Classification Search
CPC ..... H01L 33/30; H01L 29/205; H01L 21/761; H01L 51/0579; H01L 29/6603; H01L 29/861; H01L 29/8613; H01L 29/87; H01L 29/872; H01L 29/88; H01L 27/1021; H01L 27/14; H01L 27/142; H01L 27/30; H01L 27/301; H01L 51/0575; H01L 31/085
USPC ........... 257/94, 103, 183, 199, 200, 201, 603, 257/604, E27.073, E29.326, E29.329, 257/E29.335
See application file for complete search history.

(56) References Cited

U.S. PATENT DOCUMENTS

| | | | | |
|---|---|---|---|---|
| 5,148,267 A | * | 9/1992 | Ty Tan et al. | ................. 257/191 |
| 5,767,535 A | * | 6/1998 | Bachem et al. | ................. 257/96 |
| 2010/0248676 A1 | | 9/2010 | Takahashi | |

FOREIGN PATENT DOCUMENTS

| | | |
|---|---|---|
| JP | 64-037858 | 2/1989 |
| JP | 2004-039893 | 2/2004 |
| JP | 2010-251689 | 11/2010 |
| JP | 2011-061086 | 3/2011 |

* cited by examiner

Primary Examiner — Eduardo A Rodela
(74) Attorney, Agent, or Firm — Fujitsu Patent Center

(57) ABSTRACT

A semiconductor device includes a first semiconductor layer of a first conductivity type, a second semiconductor layer of a second conductivity type, and third and fourth semiconductor layers of the first conductivity type formed between the first and second semiconductor layer. The first, the third, the fourth, and the second semiconductor layers are coupled in this order. A band gap of the third semiconductor layer is narrower than that of the first semiconductor layer, and a band gap of the fourth semiconductor layer is narrower than that of the third semiconductor layer.

20 Claims, 28 Drawing Sheets

REVERSE BIAS

FORWARD BIAS

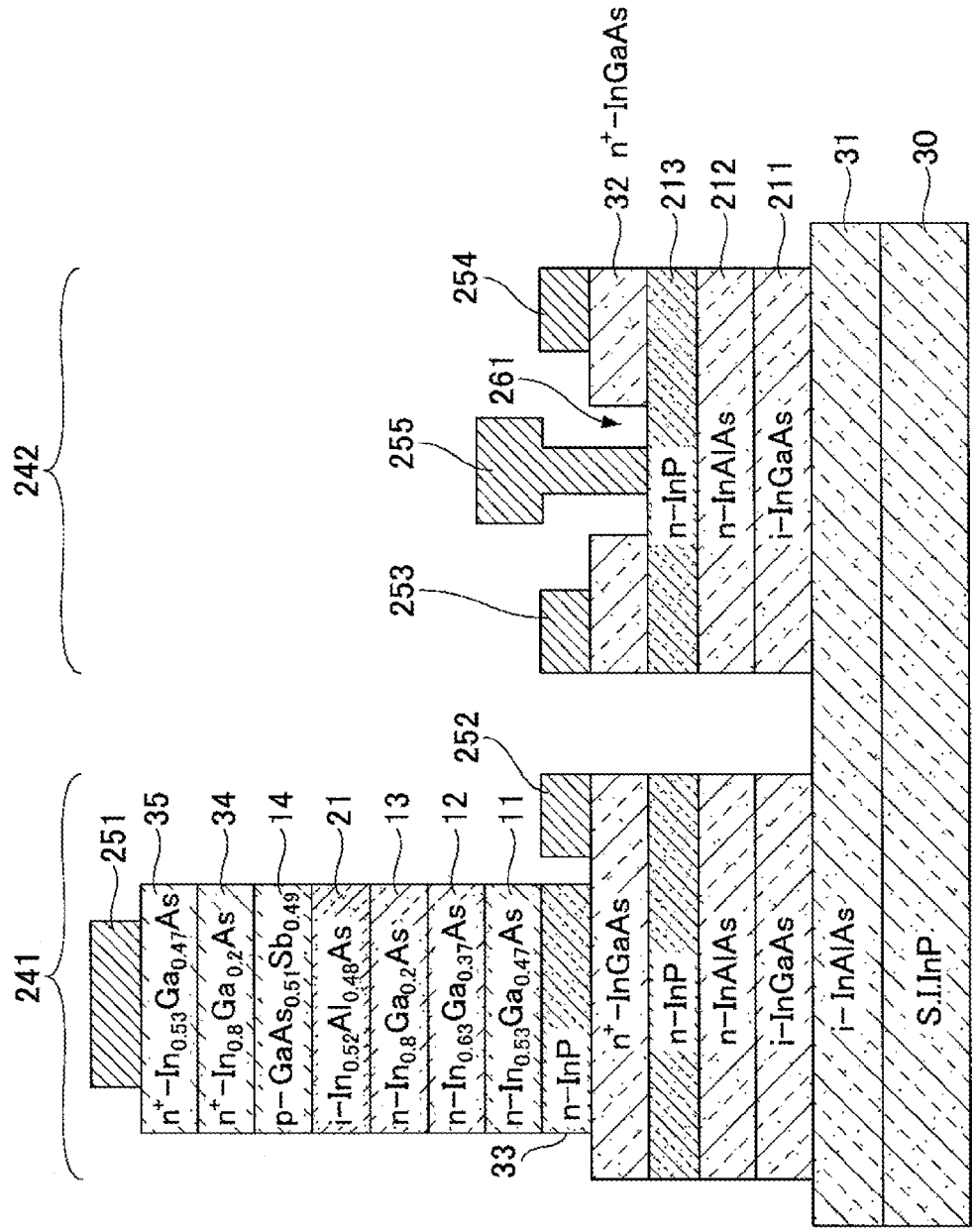

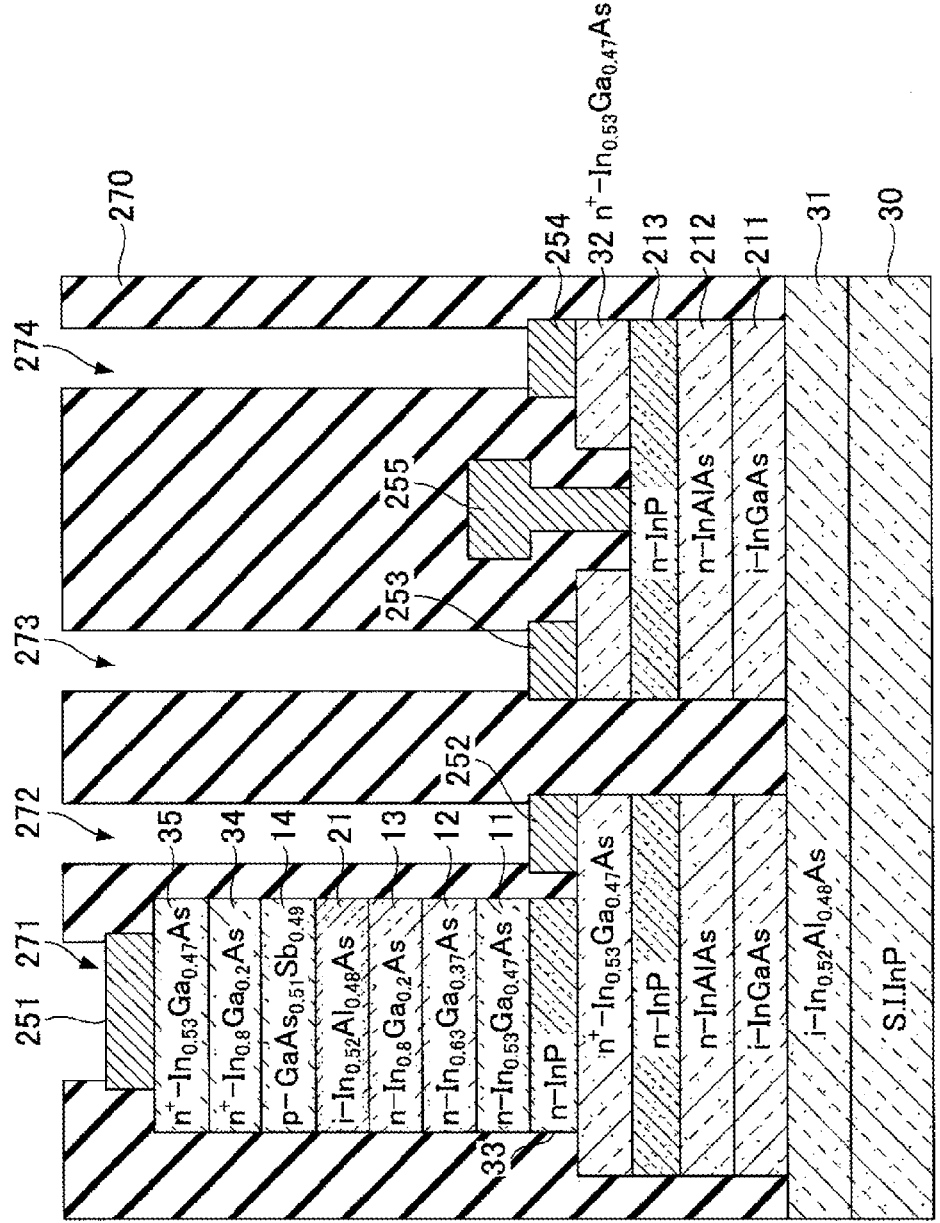

SEMICONDUCTOR DEVICE

CROSS-REFERENCE TO RELATED APPLICATIONS

This application is based upon and claims the benefit of priority of the prior Japanese Patent Application No. 2012-198509, filed on Sep. 10, 2012, the entire contents of which are incorporated herein by reference.

FIELD

The embodiments discussed herein are related to a semiconductor device.

BACKGROUND

An MMIC (Monolithic Microwave Integrated Circuit) that includes an LNA (Low Noise Amplifier) and a detector may be used to detect a weak MMW (Milli-Meter Wave). FIG. 1 illustrates a circuit diagram of an MMIC 300 that includes an LNA 302 and a detector 303. As illustrated in FIG. 1, the MMW received by an antenna 301 is amplified by the LNA 302, and after being converted into a DC (Direct Current) voltage in the detector 303, is output from an output terminal 304 as a voltage Vdet.

The MMIC 300 includes the LNA 302 and the detector 303, and an MMW detection sensitivity is greatly affected by the detector 303. Generally, a Schottky diode is used in many cases for the detector 303, however, it is difficult to obtain a sufficient detection performance in a vicinity of a 0 V bias.

For this reason, Japanese Laid-Open Patent Publication No. 2010-251689 proposes a backward diode which may be used in place of the above Schottky diode and obtain a sufficient detection performance in the vicinity of the 0 V bias.

The backward diode is basically a diode having a heterojunction, and is characterized by its band junction condition. More particularly, the backward diode has the so-called type II heterojunction in a flat band state, and the energy of the conduction band of an n-type semiconductor layer is higher than that of the valence band of a p-type semiconductor layer. The type II heterojunction refers to a heterojunction in which the energy of the conduction band of the n-type semiconductor is lower than that of conduction band of the p-type semiconductor layer, and the energy of the valence band of the n-type semiconductor layer is lower than that of the valence band of the p-type semiconductor layer.

As an example, FIGS. 2A and 2B illustrate energy band diagrams of the backward diode having a structure in which an $n^+$-InGaAs layer 311 provided as the n-type semiconductor layer, a non-doped InAlAs layer 312, and a $p^+$-GaAsSb layer 313 provided as the p-type semiconductor layer are stacked. FIG. 2A is the energy band diagram in a flat band state, and FIG. 2B is the energy band diagram in a balanced state.

The non-doped InAlAs layer 312 functions as a barrier layer, and has a band gap wider than those of the $n^+$-InGaAs layer 311 and the $p^+$-GaAsSb layer 313. In addition, one of the p-type semiconductor layer and the n-type semiconductor layer has a high doping concentration of an impurity element to a degenerating extent. In the case of the backward diode having the energy bands illustrated in FIGS. 2A and 2B, the $n^+$-InGaAs layer 311 provided as the n-type semiconductor layer is doped with an n-type impurity element to a high concentration, and the $p^+$-GaAsSb layer 313 provided as the p-type semiconductor layer is doped with a p-type impurity element to a high concentration. In the balanced state of the backward diode illustrated in FIG. 2B, an upper end energy Evp of the valence band of the $p^+$-GaAsSb layer 313 and a lower end energy Ecn of the valence band of the $n^+$-InGaAs layer 311 are approximately at the same level. In other words, although Evp<Ecn in the flat band illustrated in FIG. 2A, Evp and Ecn are approximately equal (Evp≈Ecn) in the balanced state illustrated in FIG. 2B. In FIG. 2B, a one-dot chain line indicates a Fermi level.

FIG. 3 illustrates a relationship between an applied voltage and current in the backward diode having the energy band structure illustrated in FIGS. 2A and 2B. As illustrated in FIG. 3, when a voltage is applied to the backward diode in a reverse direction as illustrated in FIG. 4A, the voltage is applied in the negative direction, and electrons flow as a tunneling current from the valence band of the $p^+$-GaAsSb layer 313 to the conduction band of the $n^+$-InGaAs layer 311. On the other hand, when a voltage is applied to the backward diode in a forward direction as illustrated in FIG. 4B, the voltage is applied in the positive direction, to form a barrier with respect to the electrons and holes, and virtually no current flows until a predetermined voltage is applied. Hence, the backward diode is highly non-liner in the vicinity of 0 V.

The applicant is aware of Japanese Laid-Open Patent Publications No. 2010-251689, No. 1-37858, No. 2004-39893, and No. 2011-61086.

Various methods to improve the detection characteristic of the backward diode are conceivable. For example, as illustrated in FIG. 5A, a conceivable backward diode may have a structure in which an $n^+$-InGaAs layer 324 doped with an impurity element to a high concentration is provided between the InAlAs layer 312 and an n-InGaAs layer 321. By providing the $n^+$-InGaAs layer 324, a curve in the conduction band of the $n^+$-InGaAs layer 324 may be made sharp, and a depletion layer that is formed may be made narrow. As a result, the width of a forbidden band becomes narrow at the energy level of the Fermi level, and the tunneling current becomes easier to flow. In this state, the concentration of the impurity element that is doped may be $1 \times 10^{18}$ cm$^{-3}$ for the n-InGaAs layer 321 and $8 \times 10^{18}$ cm$^{-3}$ for the $n^+$-InGaAs layer 324. The thickness of the $n^+$-InGaAs layer 324 is preferably on the order of the thickness of the depletion layer. In addition, a p-type semiconductor layer that is doped with a p-type impurity element to a high concentration may be provided between the $p^+$-GaAsSb layer 313 and the InAlAs layer 312. Furthermore, the p-type semiconductor layer and the n-type semiconductor layer may be bonded directly, without forming the InAlAs layer 312.

For example, as illustrated in FIG. 5B, another conceivable backward diode may have a structure in which a band adjusting layer 325 having a band gap narrower than that of the n-InGaAs layer 321 is provided between the InAlAs layer 312 and the n-InGaAs layer 321. The band adjusting layer 325 is made of a material having a lower end of the conduction band lower than that of the n-InGaAs layer 321. For example, when $In_{0.53}Ga0_{.47}As$ is used for the n-InGaAs layer 321, $In_xGa_{1-x}As$ (x>0.53) having a band gap narrower than that of the n-InGaAs layer 321 is used for the band adjusting layer 325. Hence, the tunneling current may more easily flow due to the decrease of the conduction band of the band adjusting layer 325, without having to make the curve in the conduction band of the band adjusting layer 325 sharp. A critical thickness of $In_xGa_{1-x}As$ becomes thin as the value of x increases, and thus, the value of x may preferably be on the order of 0.53<x<0.7. In addition, the thickness of the band adjusting layer 325 may preferably be on the order of 10 nm. Moreover, a p-type semiconductor layer that is doped with a p-type impurity element to a high concentration may be provided between the p⁺-GaAsSb layer 313 and the InAlAs layer 312. Furthermore, the p-type semiconductor layer and the n-type semiconductor layer may be bonded directly, without forming the InAlAs layer 312.

However, according to the backward diodes having the structures described above, the pn-junction is formed by the n-type semiconductor layer and the p-type semiconductor layer that are doped with the impurity element to a high concentration, and for this reason, a junction capacitance may become high. In addition, in a case in which the energy difference in the conduction band or the valence band of the backward diodes having the structures described above is large, the resistance of the backward diode may become high.

SUMMARY

Accordingly, it is an object in one aspect of the embodiment to provide a semiconductor device in which a tunneling current may easily flow, a pn junction capacitance may be low, and a cutoff frequency may be high.

According to one aspect of the present invention, a semiconductor device may include a first semiconductor layer of a first conductivity type; a second semiconductor layer of a second conductivity type; and a third semiconductor layer and a fourth semiconductor layer of the first conductivity type, respectively, formed between the first semiconductor layer and the second semiconductor layer, wherein the first semiconductor layer, the third semiconductor layer, the fourth semiconductor layer, and the second semiconductor layer are coupled in this order, a band gap of the third semiconductor layer is narrower than that of the first semiconductor layer, and a band gap of the fourth semiconductor layer is narrower than that of the third semiconductor layer.

According to another aspect of the present invention, a semiconductor device may include a first semiconductor layer of a first conductivity type; a second semiconductor layer of a second conductivity type; and a gradient composition semiconductor layer of the first conductivity type formed between the first semiconductor layer and the second semiconductor layer, wherein the first semiconductor layer, the gradient composition semiconductor layer, and the second semiconductor layer are coupled in this order, and a band gap of the gradient composition semiconductor layer is equal to or narrower than that of the first semiconductor layer, and gradually becomes narrower from a side provided with the first semiconductor layer towards a side provided with the second semiconductor layer.

According to still another aspect of the present invention, a semiconductor device may include a first semiconductor layer of a first conductivity type; a second semiconductor layer of a second conductivity type; and a plurality of semiconductor layers of the first conductivity type formed between the first semiconductor layer and the second semiconductor layer, wherein the first semiconductor layer, the plurality of semiconductor layers, and the second semiconductor layer are coupled in this order, a band gap of the plurality of semiconductor layers is narrower than that of the first semiconductor layer, and the band gap gradually becomes narrower from one of the plurality of semiconductor layers provided on a side of the first semiconductor layer towards another of the plurality of semiconductor layers provided on a side of the second semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 25A and 25B are cross sectional views for explaining the method of fabricating the semiconductor device in the sixth embodiment; and FIGS. 26A and 26B are cross sectional views for explaining the method of fabricating the semiconductor device in the sixth embodiment.

DESCRIPTION OF EMBODIMENTS

Figure 1:
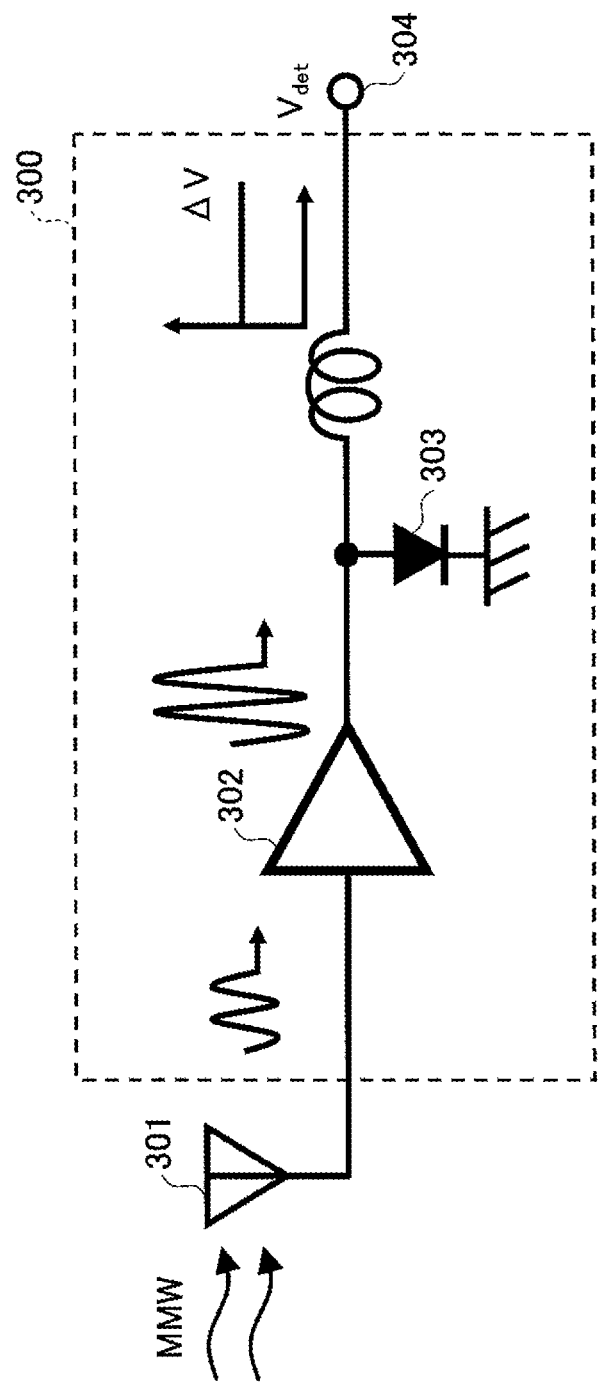
FIG. 1 is a circuit diagram illustrating an MMIC.
Figure 2A:
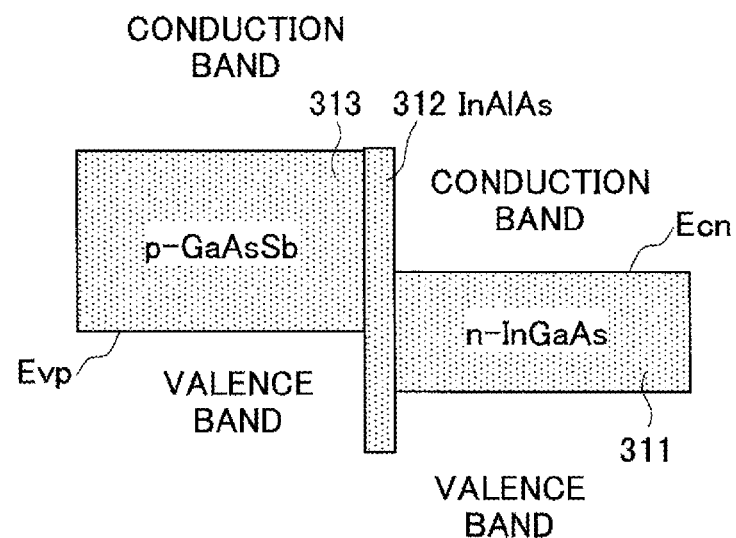
FIGS. 2A and 2B are energy band diagrams of a backward diode.
Figure 2B:
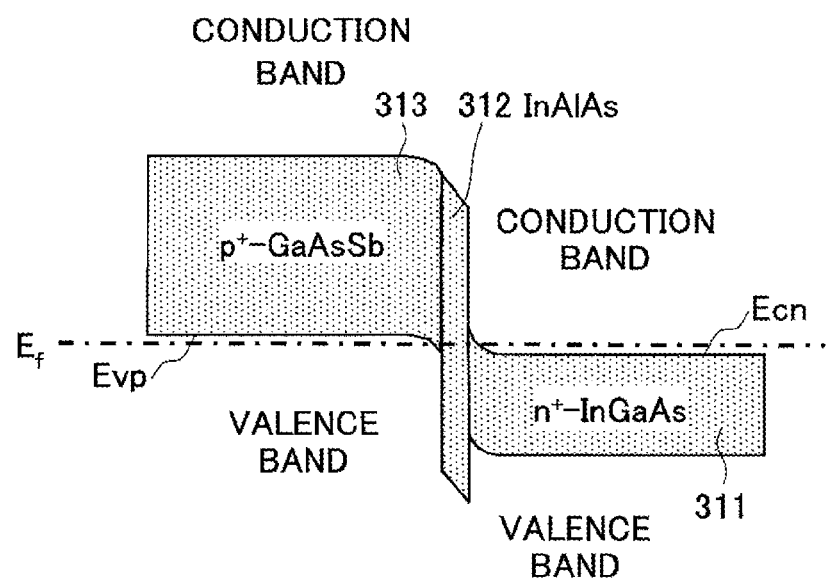
Figure 3:
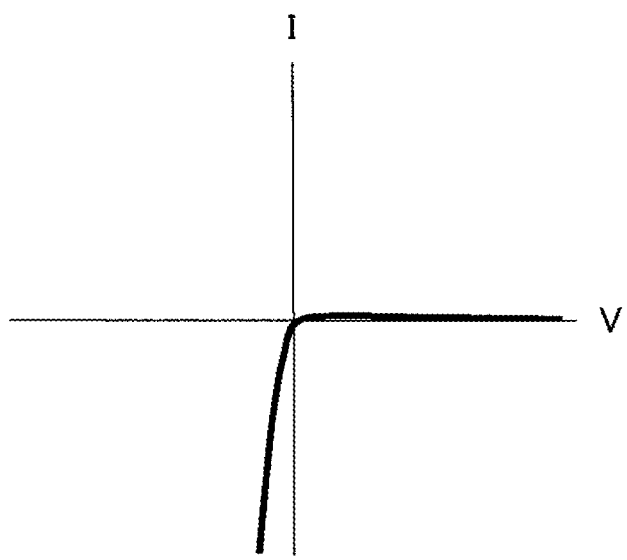
FIG. 3 is a diagram illustrating a voltage versus current characteristic of the backward diode.
Figure 4A:
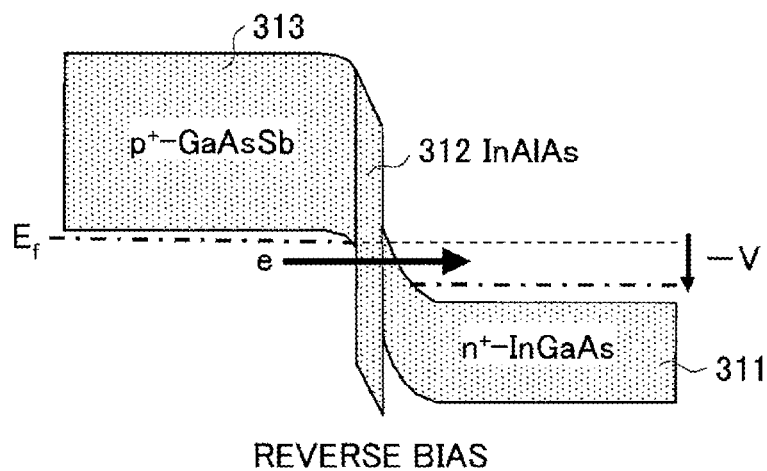
FIGS. 4A and 4B are energy band diagrams of the backward diode in a state applied with a voltage.
Figure 4B:
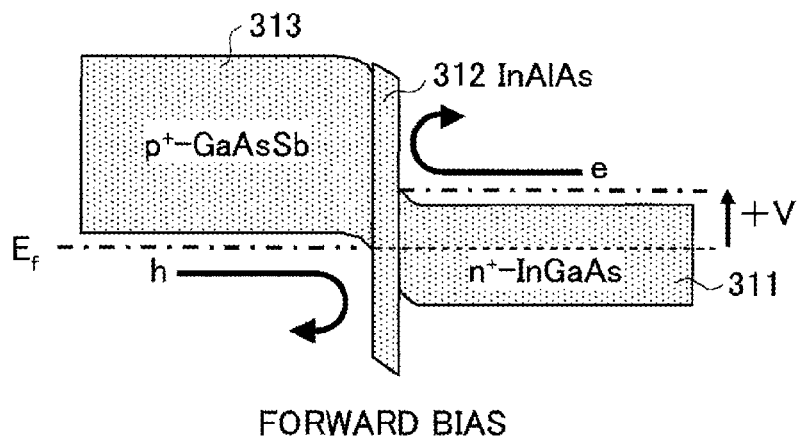
Figure 5A:
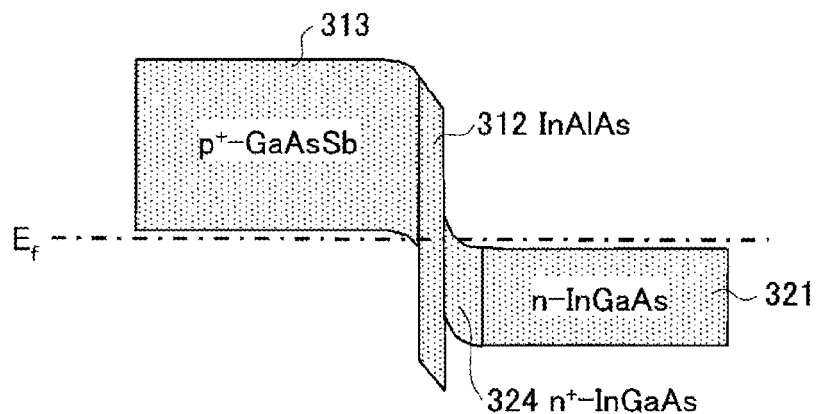
FIGS. 5A and 5B are energy band diagrams of the backward diode having another structure.
Figure 5B:
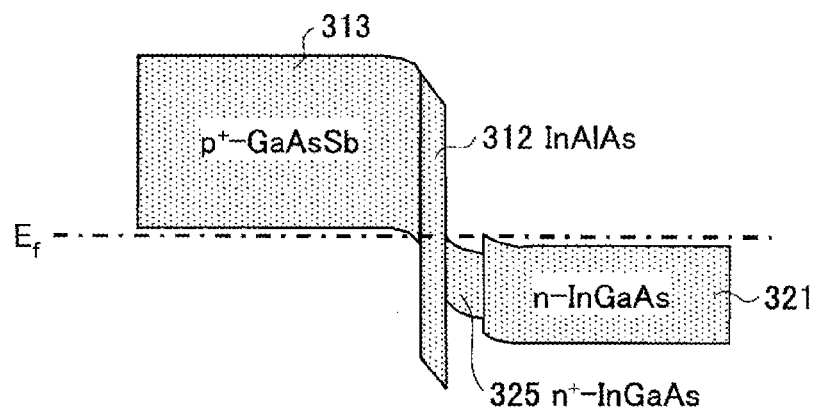

Preferred embodiments of the present invention will be described with reference to the accompanying drawings.

A description will now be given of the semiconductor device in each embodiment according to the present invention. In the following description, those parts that are the same are designated by the same reference numerals, and a repetition of the description thereof will be omitted.

First Embodiment

A description will be given of the semiconductor device in this embodiment. The backward diode is an example of the semiconductor device.

First, a description will be given of a relationship between a cutoff frequency and a junction capacitance at a pn junction. The relationship between the cutoff frequency and the junction capacitance may be represented by the following formula (1), where $f_c$ denotes the cutoff frequency, $R_s$ denotes a resistance component, and $C_j$ denotes the junction capacitance at the pn junction.

$$f_c = \frac{1}{2\pi R_s C_j} \quad (1)$$

The capacitance component Rs refers to a contact resistance or a resistance within the semiconductor. As may be seen from the formula (1), as the junction capacitance $C_j$ of the pn junction increases, the cutoff frequency $f_c$ decreases. Accordingly, in order to increase the detectable frequency, that is, in order to increase the cutoff frequency $f_c$, the junction capacitance $C_j$ at the pn junction needs to be decreased.

Figure 6A:
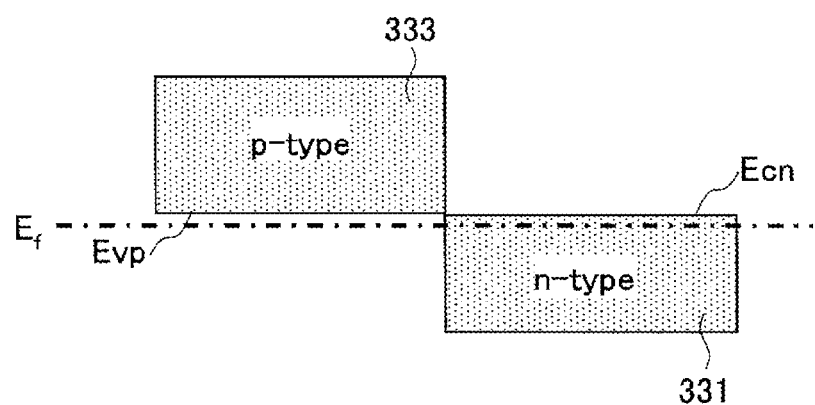
FIGS. 6A and 6B are diagrams for explaining the backward diode.
Figure 6B:
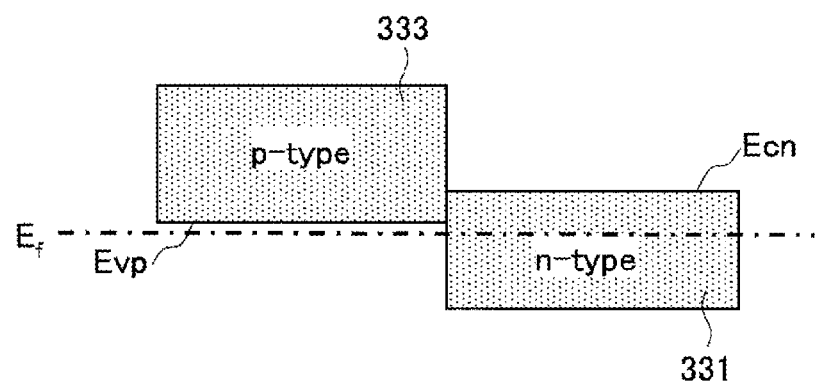

In such an ideal backward diode, the energy Ecn at the lower end of the conduction band of an n-type semiconductor layer 331 and the energy Evp at the upper end of the valence band of a p-type semiconductor layer 333 are approximately the same in the flat band state illustrated in FIG. 6A. In other words, by setting Ecn≈Evp, the ideal backward diode may be obtained. However, due to restrictions of the lattice matching and the like, it is difficult to achieve Ecn≈Evp, and the relationship Ecn>Evp may be obtained in actual practice as illustrated in FIG. 6B.

Figure 7:
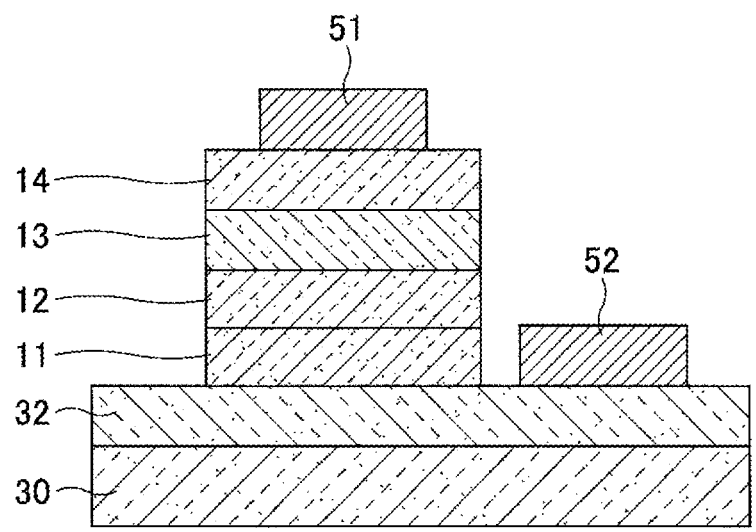
FIG. 7 is a cross sectional view illustrating a semiconductor device in a first embodiment.
Figure 8A:
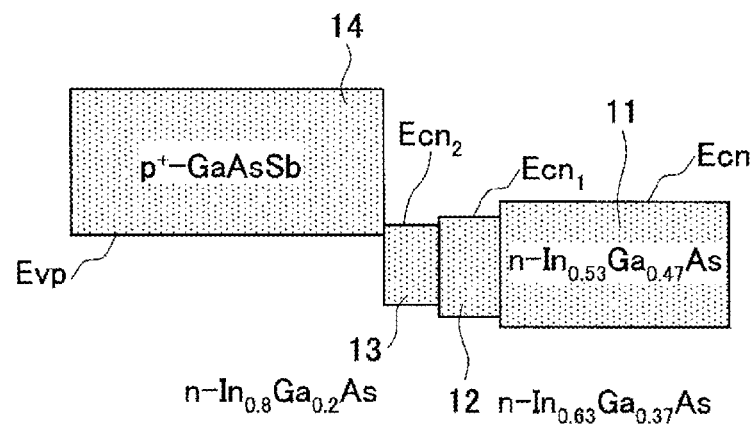
FIGS. 8A and 8B are energy band diagrams of the semiconductor device in the first embodiment.
Figure 8B:
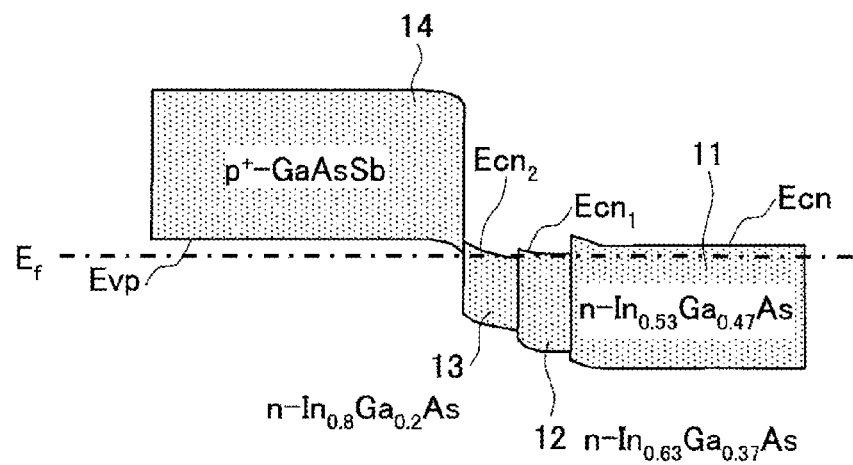

Next, a description will be given of the semiconductor device in the first embodiment, that is, the backward diode. FIG. 7 is a cross sectional view illustrating the structure of the semiconductor device in the first embodiment. In addition, FIGS. 8A and 8B are energy band diagrams of the semiconductor device in the first embodiment. FIG. 8A illustrates the energy band in the flat band state, and FIG. 8B illustrates the energy band in the balanced state.

The backward diode in this embodiment may include an InP substrate 30, and a buffer layer (not illustrated), a contact layer 32, an n-type semiconductor layer 11, a first n-type connection semiconductor layer 12, a second n-type connection semiconductor layer 13, and a p-type semiconductor layer 14 that are stacked on the InP substrate 30. In addition, an electrode 51 may be formed on the p-type semiconductor layer 14, and an electrode 52 may be formed on the contact layer 32.

In this embodiment, the band gap of the first n-type connection semiconductor layer 12 is narrower than that of the n-type semiconductor layer 11, and the band gap of the second n-type connection semiconductor layer 13 is narrower than that of the first n-type connection semiconductor layer 12. In other words, the band gap becomes narrower towards the p-type semiconductor layer 14. More particularly, the n-type semiconductor layer 11 may be formed by n-$In_{0.53}Ga_{0.47}As$, the first n-type connection semiconductor layer 12 may be formed by n-$In_{0.63}Ga_{0.37}As$, and the second n-type connection semiconductor layer 13 may be formed by n-$In_{0.8}Ga_{0.2}As$. In addition, the p-type semiconductor layer 14 may be formed by p-GaAsSb. The band gap of n-$In_{0.63}Ga_{0.37}As$ is narrower than that of n-$In_{0.53}Ga_{0.47}As$, and the band gap of n-$In_{0.8}Ga_{0.2}As$ is narrower than that of n-$In_{0.63}Ga_{0.37}As$. Accordingly, the band gap of the first n-type connection semiconductor layer 12 is formed to be narrower than that of the n-type semiconductor layer 11, and the band gap of the second n-type connection semiconductor layer 13 is formed to be narrower than that of the first n-type connection semiconductor layer 12. In this specification, the n-type semiconductor layer 11 may be referred to as a first semiconductor layer, the p-type semiconductor layer 14 may be referred to as a second semiconductor layer, the first n-type connection semiconductor layer 12 may be referred to as a third semiconductor layer, and the second n-type connection semiconductor layer 13 may be referred to as a fourth semiconductor layer.

The p-type semiconductor layer 14 is doped with an impurity element to a high concentration such that degeneracy of holes occurs. However, the n-type semiconductor layer 11, the first n-type connection semiconductor layer 12, and the second n-type connection semiconductor layer 13 are not doped with an impurity element to a high concentration such that degeneracy of electrons occurs. In other words, the n-type semiconductor layer 11, the first n-type connection semiconductor layer 12, and the second n-type connection semiconductor layer 13 are doped with the n-type impurity element to a relatively low concentration. Hence, the n-type semiconductor layer 11, the first n-type connection semiconductor layer 12, and the second n-type connection semiconductor layer 13 are doped with the impurity element to a concentration lower than that of the p-type semiconductor layer 14. In addition, the first n-type connection semiconductor layer 12 and the second n-type connection semiconductor layer 13 are formed to a thickness of 5 nm to 20 nm, for example, to a thickness of 10 nm, in order not to generate crystal anomalies.

In this embodiment, the energy Ecn at the lower end of the conduction band of the n-type semiconductor layer 11, the energy Ecn1 at the lower end of the conduction band of the first n-type connection semiconductor layer 12, and the energy Ecn2 at the lower end of the conduction band of the second n-type connection semiconductor layer 13 may be aligned approximately at the same energy level. Further, these energies Ecn, Ecn1, and Ecn2 and the energy Evp at the upper end of the valence band of the p-type semiconductor layer 14 may be aligned approximately to the Fermi level Ef.

Accordingly, even when the concentration of the impurity element in the second n-type connection semiconductor layer 13 and the like is relatively low, the energy Ecn2 at the lower end of the conduction band of the second n-type connection semiconductor layer 13 and the like may be made approximately the same as the energy Evp at the upper end of the valence band of the p-type semiconductor layer 14. In addition, the resistance of the semiconductor device does not become high because the energy levels of the energy Ecn2 at the lower end of the conduction band of the second n-type connection semiconductor layer 13 and the like and the energy Evp at the upper end of the valence band of the p-type semiconductor layer 14 may be aligned.

In the example described above, two n-type semiconductor layers having different composition ratios, that is, the first n-type connection semiconductor layer 12 and the second n-type connection semiconductor layer 13, are formed between the n-type semiconductor layer 11 and the p-type semiconductor layer 14. However, in this embodiment, three or more n-type semiconductor layers having different compositions and band gaps that are narrower towards the p-type semiconductor layer 14 may be formed between the n-type semiconductor layer 11 and the p-type semiconductor layer 14. Moreover, a first p-type connection semiconductor layer and a second p-type connection semiconductor layer having different compositions and band gaps that are narrower than that of the p-type semiconductor layer 14 may be provided on the side of the p-type semiconductor layer 14, such that the band gaps of the first p-type connection semiconductor layer and the second p-type connection semiconductor layer are narrower towards the n-type semiconductor layer 11. In this case, the concentration of the impurity element that is doped may be lower for the p-type semiconductor layer 14, the first p-type connection semiconductor layer, and the second p-type connection semiconductor layer than for the n-type semiconductor layer 11. In this embodiment, the first and second n-type connection semiconductor layers 12 and 13, or the first and second p-type semiconductor layers, or both the first and second n-type connection semiconductor layers 12 and 13 and the first and second p-type semiconductor layers may be provided.

A doping concentration $N_D$ of the n-type impurity element and the junction capacitance $C_j$ may satisfy the following relationship (2).

$$C_j \propto \sqrt{N_D} \qquad (2)$$

As indicated by the above relationship (2), the junction capacitance $C_j$ is proportional to the square root of the doping concentration $N_D$ of the impurity element. Because the cutoff frequency $f_c$ is proportional to the inverse number of the junction capacitance $C_j$ as indicated by the above formula (1), the cutoff frequency $f_c$ may be increased by decreasing the doping concentration $N_D$ of the impurity element. As described above, in the semiconductor device of this embodiment, the n-type impurity element that dopes the second n-type connection semiconductor layer 13 and the like has the relatively low concentration, and the junction capacitance $C_j$ may be made small compared to a case in which the impurity element is doped to a high concentration. Accordingly, the cutoff frequency $f_c$ may be made high in the semiconductor device of this embodiment.

When the semiconductor device of this embodiment is used for a detector, a detection sensitivity $\beta_v$ may be improved. In other words, the detection sensitivity $\beta_v$ and the junction capacitance $C_j$ satisfy the following relationship (3), and the detection sensitivity $\beta_v$ may be increased by reducing the junction capacitance $C_j$, to thereby improve the detection sensitivity $\beta_v$. In the relationship (3), $\gamma$ denotes a curvature coefficient, and $R_j$ denotes a junction resistance.

$$\beta_v \approx \frac{\gamma}{2/R_j + 8(\pi f C_j)^2 R_s} \qquad (3)$$

Therefore, according to the semiconductor device of this embodiment, the inter-band tunneling effect of electrons may easily be obtained, and the resistance of the semiconductor device may be reduced. In addition, because the resistance of the semiconductor device may be low even when the concentration of the n-type impurity element or the like that is doped is low, the pn junction capacitance may be reduced, and the cutoff frequency may be made high. Hence, the performance of the MMW detector may be improved by using the semiconductor device of this embodiment in the MMW detector.

(Method of Fabricating Semiconductor Device)

Next, a description will be given of the method of fabricating the semiconductor device of this embodiment. More particularly, a description will be given of the method of fabricating a backward diode, as the method of fabricating the semiconductor device of this embodiment, by referring to FIGS. 9A, 9B, 10A, and 10B.

Figure 9A:
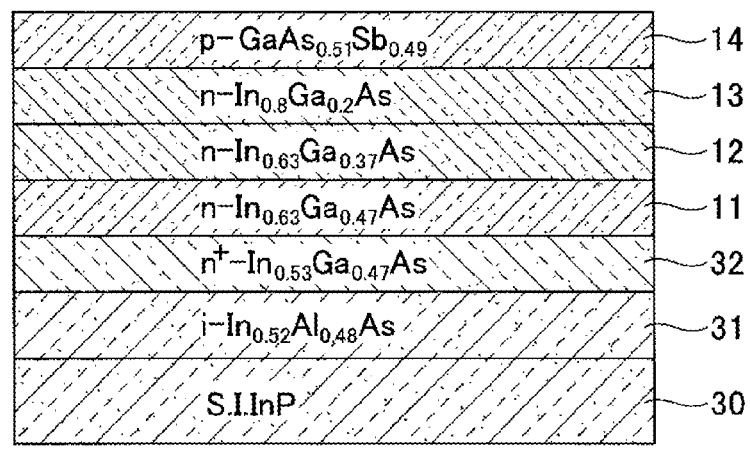
FIGS. 9A and 9B are cross sectional views for explaining a method of fabricating the semiconductor device in the first embodiment.

First, as illustrated in FIG. 9A, semiconductor layers are stacked on a semi-insulating InP substrate 30 by epitaxially growing each semiconductor layer by MOCVD (Metal Organic Chemical Vapor Deposition). More particularly, a buffer layer 31, a contact layer 32, an n-type semiconductor layer 11, a first n-type connection semiconductor layer 12, a second n-type connection semiconductor layer 13, and a p-type semiconductor layer 14 are stacked on the InP substrate 30.

The buffer layer 31 may be formed by an i-$In_{0.52}Al_{0.48}As$ layer having a thickness of approximately 300 nm.

The contact layer 32 may be formed by an $n^+$-$In_{0.53}Ga_{0.47}As$ layer having a thickness of approximately 200 nm, and doped with Si (silicon) as the impurity element to a concentration of $1 \times 10^{19}$ cm$^{-3}$.

The n-type semiconductor layer 11 may be formed by an n-$In_{0.53}Ga_{0.47}As$ layer having a thickness of approximately 50 nm, and doped with Si as the impurity element to a concentration of $1 \times 10^{18}$ cm$^{-3}$.

The first n-type connection semiconductor layer 12 may be formed by an n-$In_{0.63}Ga_{0.37}As$ layer having a thickness of approximately 10 nm, and doped with Si as the impurity element to a concentration of $1 \times 10^{18}$ cm$^{-3}$.

The second n-type connection semiconductor layer 13 may be formed by an n-$In_{0.8}Ga_{0.2}As$ layer having a thickness of approximately 5 nm, and doped with Si as the impurity element to a concentration of $1 \times 10^{18}$ cm$^{-3}$.

The p-type semiconductor layer 14 may be formed by an $p^+$-$GaAs_{0.51}Sb_{0.49}$ layer having a thickness of approximately 50 nm, and doped with Zn (zinc) as the impurity element to a concentration of $2 \times 10^{19}$ cm$^{-3}$.

The $In_{0.52}Al_{0.48}As$ and $GaAs_{0.51}Sb_{0.49}$ described above are compositions that form a lattice matching with InP.

Figure 9B:
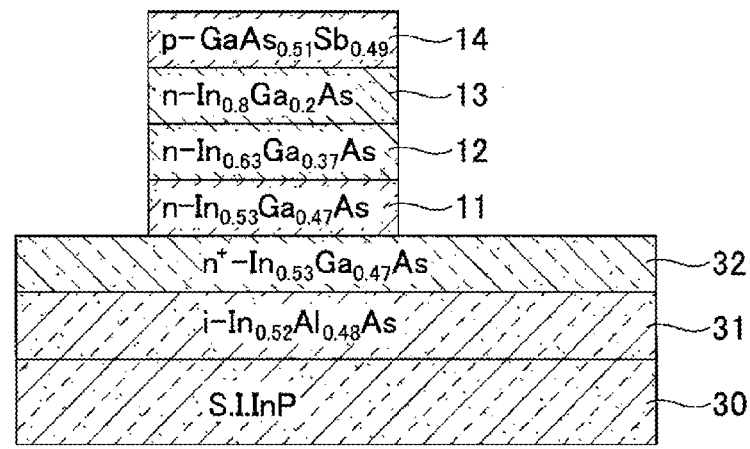

Next, as illustrated in FIG. 9B, a portion of the surface of the contact layer 32 is exposed by a wet etching. More particularly, a photoresist (not illustrated) is coated on the surface of the p-type semiconductor layer 14, and a resist pattern (not illustrated) is formed by exposing the photoresist by an exposure apparatus and developing the exposed photoresist. Thereafter, the p-type semiconductor layer 14, the second n-type connection semiconductor layer 13, the first n-type connection semiconductor layer 12, and the n-type semiconductor layer 11 are removed by a wet etching at regions where the resist pattern is not formed. Then, the resist pattern is removed by an organic solvent or the like. The wet etching may use an etchant that is a mixture of phosphoric acid and hydrogen peroxide solution, for example. Hence, the p-type semiconductor layer 14, the second n-type connection semiconductor layer 13, the first n-type connection semiconductor layer 12, and the n-type semiconductor layer 11 may be formed to a mesa shape, and expose a portion of the surface of the contact layer 32.

Figure 10A:
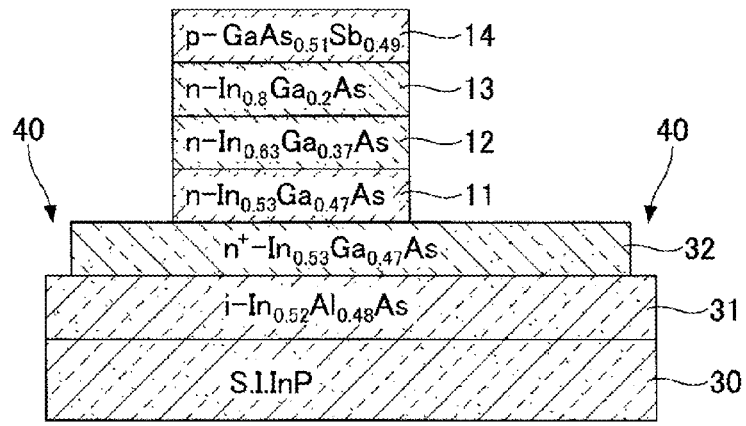
FIGS. 10A and 10B are cross sectional views for explaining the method of fabricating the semiconductor device in the first embodiment.

Next, as illustrated in FIG. 10A, an element isolation region 40 is formed. More particularly, a photoresist (not illustrated) is coated on the side where the surface of the semiconductor layer, such as the contact layer 32, is exposed, and a resist pattern (not illustrated) having an opening at a portion where the element isolation region 40 is to be formed is formed by exposing the photoresist by the exposure apparatus and developing the exposed photoresist. Thereafter, the contact layer 32 is removed by a wet etching at regions where the resist pattern is not formed, and the resist pattern is removed by an organic solvent or the like. The wet etching may use an etchant that is a mixture of phosphoric acid and hydrogen peroxide solution, for example. Hence, the element isolation region 40 may be formed by removing a portion of the contact layer 32.

Figure 10B:
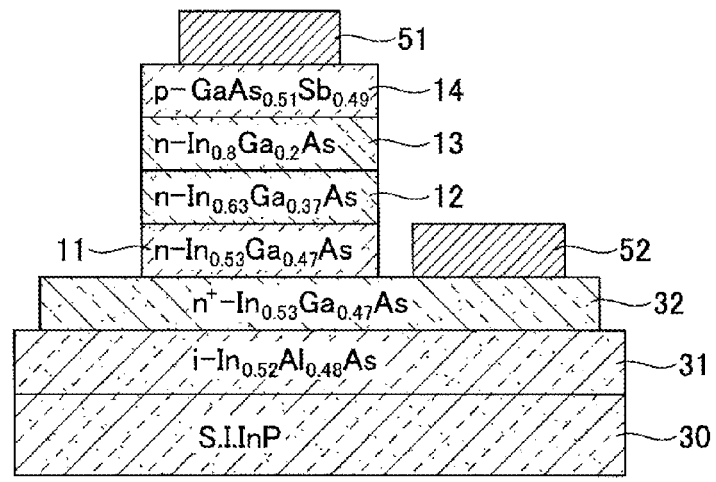

Next, as illustrated in FIG. 10B, an electrode 51 and an electrode 52 of the backward diode are formed. More particularly, a photoresist (not illustrated) is coated on the side where the surface of the semiconductor layer, such as the contact layer 32, is exposed, and a resist pattern (not illustrated) having openings at portions where the electrodes 51 and 52 are to be formed are formed by exposing the photoresist by the exposure apparatus and developing the exposed photoresist. Thereafter, a stacked structure of metal layers, including a Ti (titanium) layer having a thickness of 10 nm, a Pt (platinum) layer having a thickness of 30 nm, and an Au (gold) layer having a thickness of 300 nm, is formed by vapor deposition, and the metal layers formed on the resist pattern are removed by a lift-off by dipping the structure into an organic solvent. By forming the metal layers, the electrodes 51 and 52 making ohmic contact with the p-type semiconductor layer 14 and the contact layer 32, respectively, may be formed. The electrodes 51 and 52 may form the electrodes of the backward diode in this embodiment, and the electrode 51 forms one of the diode electrodes and the electrode 52 forms the other of the diode electrodes.

The backward diode of this embodiment may be fabricated by the process described above.

Second Embodiment

Figure 11:
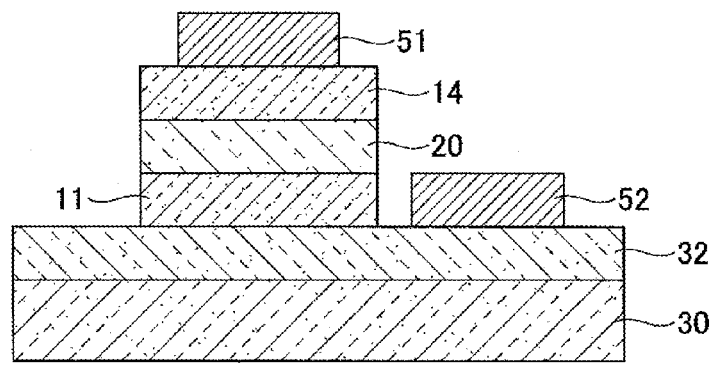
FIG. 11 is a cross sectional view illustrating the semiconductor device in a second embodiment.
Figure 12A:
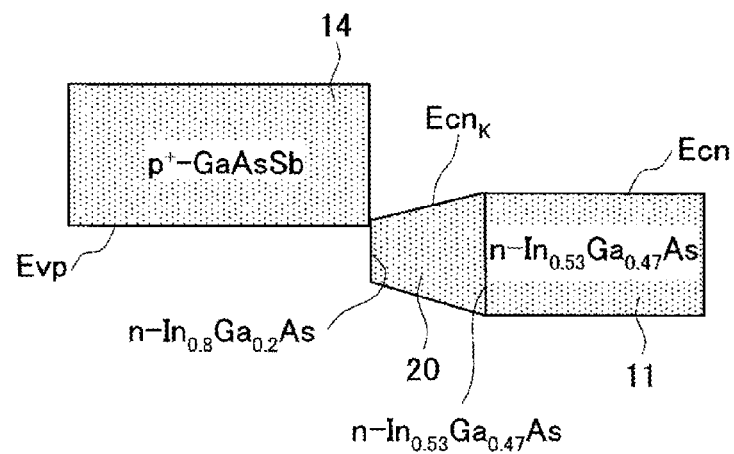
FIGS. 12A and 12B are energy band diagrams of the semiconductor device in the second embodiment.
Figure 12B:
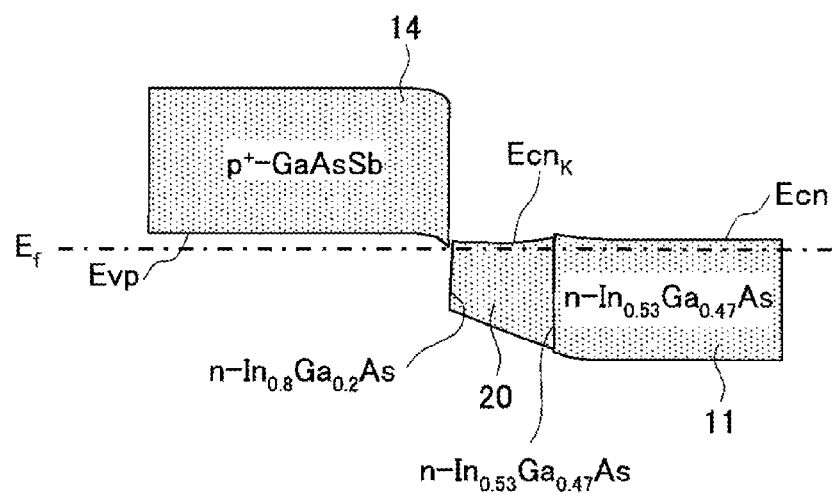

Next, a description will be given of the semiconductor device in a second embodiment. In this embodiment, an n-type gradient composition semiconductor layer 20 is provided in place of the first and second n-type connection semiconductor layers 12 and 13 of the semiconductor device in the first embodiment. FIG. 11 is a cross sectional view illustrating the semiconductor device in the second embodiment. In addition, FIGS. 12A and 12B are energy band diagrams of the semiconductor device in the second embodiment. FIG. 12A illustrates the energy band in the flat band state, and FIG. 12B illustrates the energy band in the balanced state.

The backward diode in this embodiment may include an InP substrate 30, and a buffer layer (not illustrated), a contact layer 32, an n-type semiconductor layer 11, an n-type gradient composition semiconductor layer 20, and a p-type semiconductor layer 14 that are stacked on the InP substrate 30. An electrode 51 may be formed on the p-type semiconductor layer 14, and an electrode 52 may be formed on the contact layer 32.

A band gap of the n-type gradient composition semiconductor layer 20 is equal to or narrower than that of the n-type semiconductor layer 11, and gradually becomes narrower from a side in contact with the n-type semiconductor layer 11 towards a side in contact with the p-type semiconductor layer 14 due to the gradient composition of the n-type gradient composition semiconductor layer 20. More particularly, the n-type gradient composition semiconductor layer 20 is formed so that the In gradually increases and the Ga gradually decreases from the composition ratio of $In_{0.53}Ga_{0.47}As$ on the side in contact with the n-type semiconductor layer 11, such that the side in contact with the p-type semiconductor layer 14 becomes $In_{0.8}Ga_{0.2}As$. Hence, the band gap becomes narrower when the In in InGaAs increases and the Ga in InGaAs decreases. Accordingly, in the n-type gradient composition semiconductor layer 20, the band gap becomes narrower from the side in contact with the n-type semiconductor layer 11 towards the side in contact with the p-type semiconductor layer 14. The n-type semiconductor layer 11 may be formed by n-In0.53Ga0.47As.

The p-type semiconductor layer 14 is doped with an impurity element to a high concentration such that degeneracy of holes occurs. However, the n-type semiconductor layer 11 and the n-type gradient composition semiconductor layer 20 are not doped with an impurity element to a high concentration such that degeneracy of electrons occurs. In other words, the n-type semiconductor layer 11 and the n-type gradient composition semiconductor layer 20 are doped with the n-type impurity element to a relatively low concentration. Hence, the n-type semiconductor layer 11 and the n-type gradient composition semiconductor layer 20 are doped with the impurity element to a concentration lower than that of the p-type semiconductor layer 14. In this embodiment, because the n-type gradient composition semiconductor layer 20 has the gradient composition, and the anomaly in the crystal is unlikely to occur.

In this embodiment, the energy Ecn at the lower end of the conduction band of the n-type semiconductor layer 11, the energy EcnK at the lower end of the conduction band of the n-type gradient composition semiconductor layer 20, and the energy Evp at the upper end of the valence band of the p-type semiconductor layer 14 may be aligned approximately to the Fermi level Ef.

Accordingly, even when the concentration of the impurity element in the n-type gradient composition semiconductor layer 20 and the like is relatively low, the energy EcnK at the lower end of the conduction band of the n-type gradient composition semiconductor layer 20 and the like may be made approximately the same as the energy Evp at the upper end of the valence band of the p-type semiconductor layer 14. In addition, the resistance of the semiconductor device does not become high because the energy levels of the energy EcnK at the lower end of the conduction band of the n-type gradient composition semiconductor layer 20 and the like and the energy Evp at the upper end of the valence band of the p-type semiconductor layer 14 may be aligned.

The semiconductor device in this embodiment may be fabricated by performing a process of forming the n-type gradient composition semiconductor layer 20 in place of the process of forming the first and second n-type connection semiconductor layers 12 and 13 in the method of fabricating the semiconductor device of the first embodiment.

A p-type gradient composition semiconductor layer having a band gap narrower than that of the p-type semiconductor layer 14, and becoming narrower towards the side provided with the n-type semiconductor layer 11, may be formed at the side provided with the p-type semiconductor layer 14. In this case, the concentration of the impurity element that is doped may be lower for the p-type semiconductor layer 14 and the p-type gradient composition semiconductor layer than for the n-type semiconductor layer 11. In this embodiment, the n-type gradient composition semiconductor layer 20, or the p-type gradient composition semiconductor layer, or both the n-type gradient composition semiconductor layer 20 and the p-type gradient composition semiconductor layer may be provided.

Therefore, according to the semiconductor device of this embodiment, the inter-band tunneling effect of electrons may easily be obtained, and the resistance of the semiconductor device may be reduced. In addition, because the resistance of the semiconductor device may be low even when the concentration of the n-type impurity element or the like that is doped is low, the pn junction capacitance may be reduced, and the cutoff frequency may be made high. Hence, the performance of the MMW detector may be improved by using the semiconductor device of this embodiment in the MMW detector. Other features and effects of this embodiment may be the same as those of the first embodiment described above.

Third Embodiment

Figure 13:
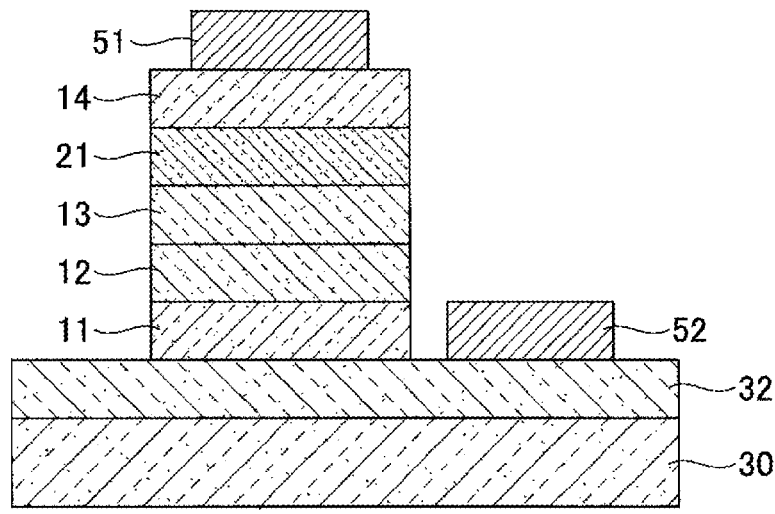
FIG. 13 is a cross sectional view illustrating the semiconductor device in a third embodiment.
Figure 14:
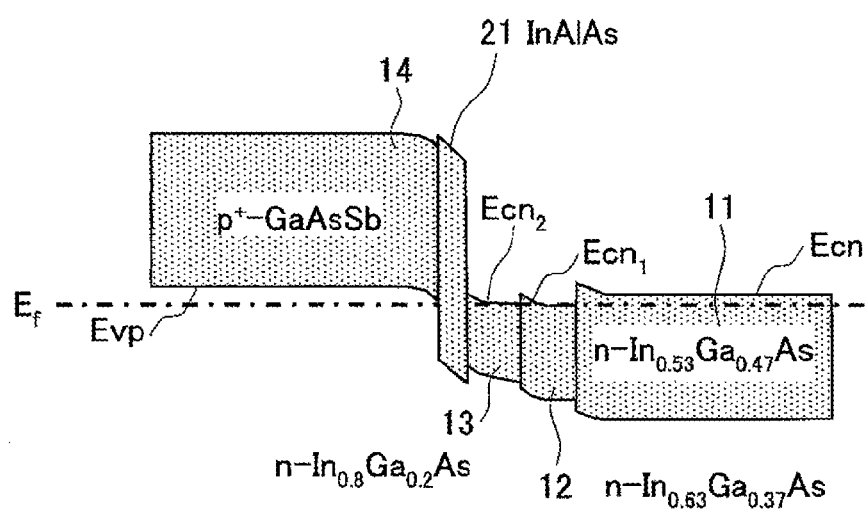
FIG. 14 is an energy band diagram of the semiconductor device in the third embodiment.

Next, a description will be given of the semiconductor device in a third embodiment. In this embodiment, a barrier layer 21 is provided between the second n-type connection semiconductor layer 13 and the p-type semiconductor layer 14 of the semiconductor device in the first embodiment. FIG. 13 is a cross sectional view illustrating the semiconductor device in the third embodiment. In addition, FIG. 14 is an energy band diagram of the semiconductor device in the third embodiment. FIG. 14 illustrates the energy band in the balanced state.

The backward diode in this embodiment may include an InP substrate 30, and a buffer layer (not illustrated), a contact layer 32, an n-type semiconductor layer 11, a first n-type connection semiconductor layer 12, an n-type connection semiconductor layer 13, the barrier layer 21, and a p-type semiconductor layer 14 that are stacked on the InP substrate 30. An electrode 51 is formed on the p-type semiconductor layer 14, and an electrode 52 is formed on the contact layer 32.

The barrier layer 21 may be formed by an i-InAlAs, and a band gap of the barrier layer 21 may be wider than those of the n-type semiconductor layer 11, the first n-type connection semiconductor layer 12, the second n-type connection semiconductor layer 13, and the p-type semiconductor layer 14.

In this embodiment, the energy Ecn at the lower end of the conduction band of the n-type semiconductor layer 11, the energy Ecn1 at the lower end of the conduction band of the first n-type connection semiconductor layer 12, and the energy Ecn2 at the lower end of the conduction band of the second n-type connection semiconductor layer 13 may be aligned approximately at the same energy level. Further, these energies Ecn, Ecn1, and Ecn2 and the energy Evp at the upper end of the valence band of the p-type semiconductor layer 14 may be aligned approximately to the Fermi level Ef.

Accordingly, even when the concentration of the impurity element in the second n-type connection semiconductor layer 13 and the like is relatively low, the energy Ecn2 at the lower end of the conduction band of the second n-type connection semiconductor layer 13 and the like may be made approximately the same as the energy Evp at the upper end of the valence band of the p-type semiconductor layer 14. In addition, the resistance of the semiconductor device does not become high because the energy levels of the energy Ecn2 at the lower end of the conduction band of the second n-type connection semiconductor layer 13 and the like and the energy Evp at the upper end of the valence band of the p-type semiconductor layer 14 may be aligned.

(Method of Fabricating Semiconductor Device)

Next, a description will be given of the method of fabricating the semiconductor device of this embodiment. More particularly, a description will be given of the method of fabricating a backward diode, as the method of fabricating the semiconductor device of this embodiment, by referring to FIGS. 15A, 15B, 16A, and 16B.

Figure 15A:
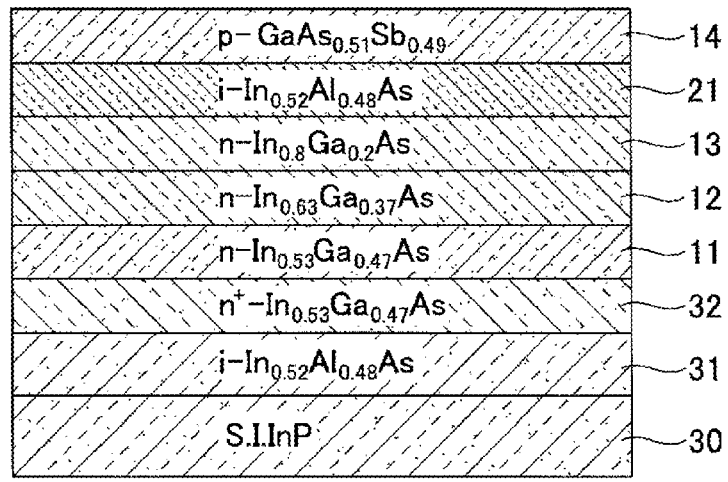
FIGS. 15A and 15B are cross sectional views for explaining a method of fabricating the semiconductor device in the third embodiment.

First, as illustrated in FIG. 15A, semiconductor layers are stacked on a semi-insulating InP substrate 30 by epitaxially growing each semiconductor layer by MOCVD. More particularly, a buffer layer 31, a contact layer 32, an n-type semiconductor layer 11, a first n-type connection semiconductor layer 12, a second n-type connection semiconductor layer 13, a barrier layer 21, and a p-type semiconductor layer 14 are stacked on the InP substrate 30.

The buffer layer 31 may be formed by an i-$In_{0.52}Al_{0.48}As$ layer having a thickness of approximately 300 nm.

The contact layer 32 may be formed by an $n^+$-$In_{0.53}Ga_{0.47}As$ layer having a thickness of approximately 200 nm, and doped with Si as the impurity element to a concentration of $1 \times 10^{19}$ cm$^{-3}$.

The n-type semiconductor layer 11 may be formed by an n-$In_{0.53}Ga_{0.47}As$ layer having a thickness of approximately 50 nm, and doped with Si as the impurity element to a concentration of $1 \times 10^{18}$ cm$^{-3}$.

The first n-type connection semiconductor layer 12 may be formed by an n-$In_{0.63}Ga_{0.37}As$ layer having a thickness of approximately 10 nm, and doped with Si as the impurity element to a concentration of $1 \times 10^{18}$ cm$^{-3}$.

The second n-type connection semiconductor layer 13 may be formed by an n-$In_{0.8}Ga_{0.2}As$ layer having a thickness of approximately 5 nm, and doped with Si as the impurity element to a concentration of $1 \times 10^{18}$ cm$^{-3}$.

The barrier layer 21 may be formed by an i-$In_{0.52}Al_{0.48}As$ layer having a thickness of approximately 3 nm. The band gap of the barrier layer 21 is wider than those of the n-type semiconductor layer 11, the first n-type connection semiconductor layer 12, the second n-type connection semiconductor layer 13, and the p-type semiconductor layer 14.

The p-type semiconductor layer 14 may be formed by an $p^+$-$GaAs_{0.51}Sb_{0.49}$ layer having a thickness of approximately 50 nm, and doped with Zn as the impurity element to a concentration of $2 \times 10^{19}$ cm$^{-3}$.

The $In_{0.52}Al_{0.48}As$ and $GaAs_{0.51}Sb_{0.49}$ described above are compositions that form a lattice matching with InP.

Figure 15B:
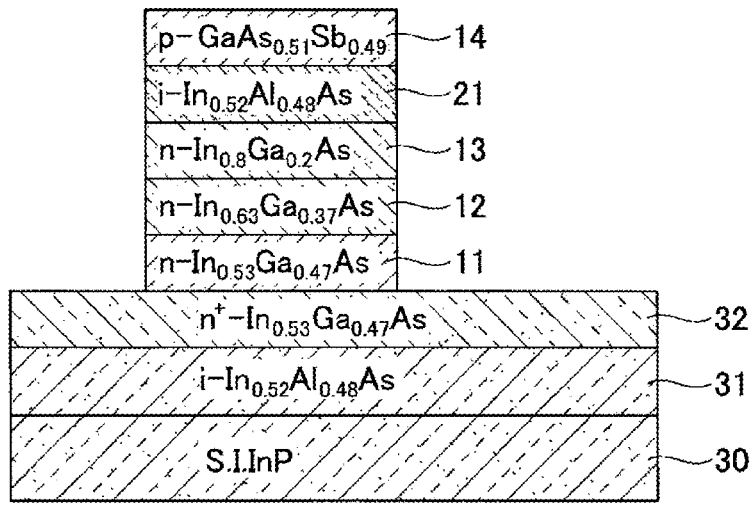

Next, as illustrated in FIG. 15B, a portion of the surface of the contact layer 32 is exposed by a wet etching. More particularly, a photoresist (not illustrated) is coated on the surface of the p-type semiconductor layer 14, and a resist pattern (not illustrated) is formed by exposing the photoresist by an exposure apparatus and developing the exposed photoresist. Thereafter, the p-type semiconductor layer 14, the barrier layer 21, the second n-type connection semiconductor layer 13, the first n-type connection semiconductor layer 12, and the n-type semiconductor layer 11 are removed by a wet etching at regions where the resist pattern is not formed. Then, the resist pattern is removed by an organic solvent or the like. The wet etching may use an etchant that is a mixture of phosphoric acid and hydrogen peroxide solution, for example. Hence, the p-type semiconductor layer 14, the barrier layer 21, the second n-type connection semiconductor layer 13, the first n-type connection semiconductor layer 12, and the n-type semiconductor layer 11 may be formed to a mesa shape, and expose a portion of the surface of the contact layer 32.

Figure 16A:
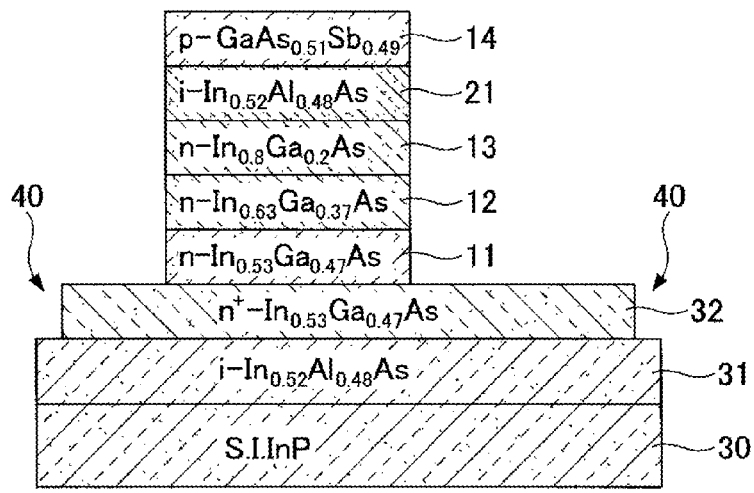
FIGS. 16A and 16B are cross sectional views for explaining the method of fabricating the semiconductor device in the third embodiment.

Next, as illustrated in FIG. 16A, an element isolation region 40 is formed. More particularly, a photoresist (not illustrated) is coated on the side where the surface of the semiconductor layer, such as the contact layer 32, is exposed, and a resist pattern (not illustrated) having an opening at a portion where the element isolation region 40 is to be formed is formed by exposing the photoresist by the exposure apparatus and developing the exposed photoresist. Thereafter, the contact layer 32 is removed by a wet etching at regions where the resist pattern is not formed, and the resist pattern is removed by an organic solvent or the like. The wet etching may use an etchant that is a mixture of phosphoric acid and hydrogen peroxide solution, for example. Hence, the element isolation region 40 may be formed by removing a portion of the contact layer 32.

Figure 16B:
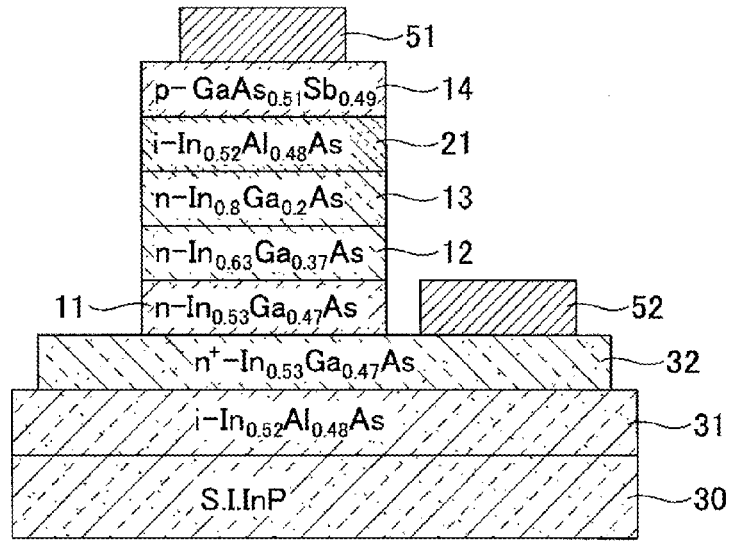

Next, as illustrated in FIG. 16B, an electrode 51 and an electrode 52 of the backward diode are formed. More particularly, a photoresist (not illustrated) is coated on the side where the surface of the semiconductor layer, such as the contact layer 32, is exposed, and a resist pattern (not illustrated) having openings at portions where the electrodes 51 and 52 are to be formed are formed by exposing the photoresist by the exposure apparatus and developing the exposed photoresist. Thereafter, a stacked structure of metal layers, including a Ti (titanium) layer having a thickness of 10 nm, a Pt (platinum) layer having a thickness of 30 nm, and an Au (gold) layer having a thickness of 300 nm, is formed by vapor deposition, and the metal layers formed on the resist pattern are removed by a lift-off by dipping the structure into an organic solvent. By forming the metal layers, the electrodes 51 and 52 making ohmic contact with the p-type semiconductor layer 14 and the contact layer 32, respectively, may be formed. The electrodes 51 and 52 may form the electrodes of the backward diode in this embodiment, and the electrode 51 forms one of the diode electrodes and the electrode 52 forms the other of the diode electrodes.

The backward diode of this embodiment may be fabricated by the process described above.

Other features and effects of this embodiment may be the same as those of the first embodiment described above.

Fourth Embodiment

Figure 17:
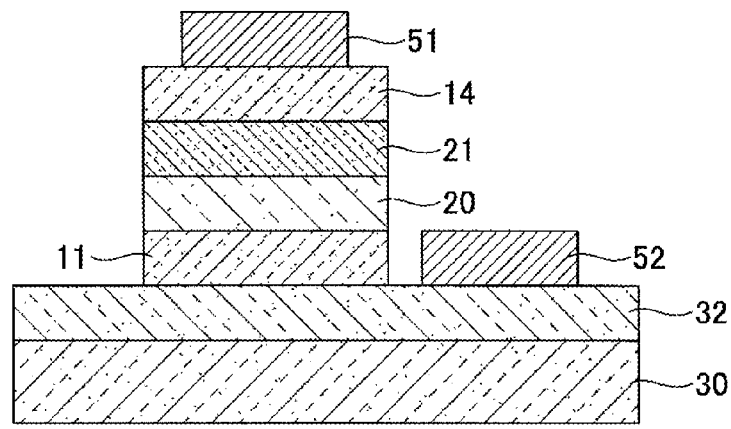
FIG. 17 is a cross sectional view illustrating the semiconductor device in a fourth embodiment.
Figure 18:
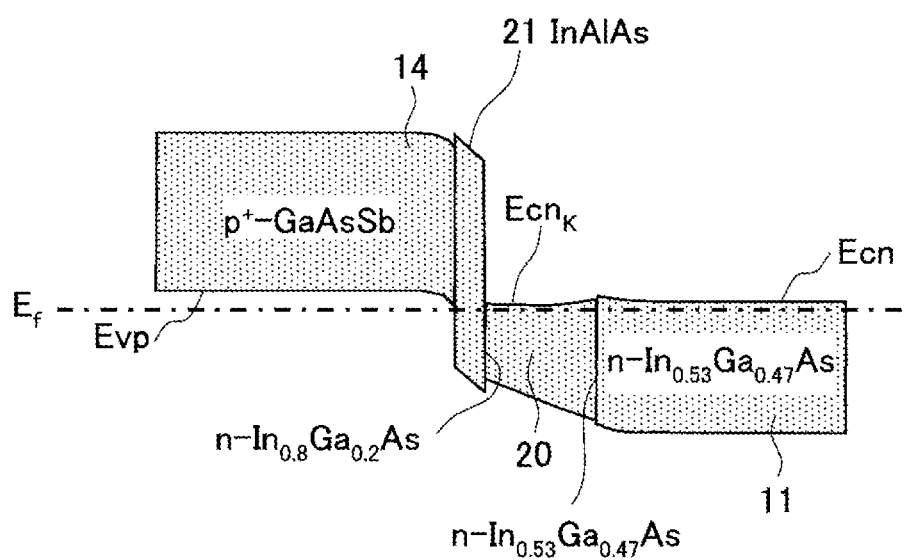
FIG. 18 is an energy band diagram of the semiconductor device in the fourth embodiment.

Next, a description will be given of the semiconductor device in a fourth embodiment. In this embodiment, a barrier layer 21 similar to that of the semiconductor device in the third embodiment is provided between the n-type gradient composition semiconductor layer 20 and the p-type semiconductor layer 14 of semiconductor device in the second embodiment. FIG. 17 is a cross sectional view illustrating the semiconductor device in the fourth embodiment. In addition, FIG. 18 is an energy band diagram of the semiconductor device in the fourth embodiment. FIG. 18 illustrates the energy band in the balanced state.

The backward diode in this embodiment may include an InP substrate 30, and a buffer layer (not illustrated), a contact layer 32, an n-type semiconductor layer 11, an n-type gradient composition semiconductor layer 20, a barrier layer 21, and a p-type semiconductor layer 14 that are stacked on the InP substrate 30. In addition, an electrode 51 may be formed on the p-type semiconductor layer 14, and an electrode 52 may be formed on the contact layer 32.

A band gap of the n-type gradient composition semiconductor layer 20 is equal to or narrower than that of the n-type semiconductor layer 11, and gradually becomes narrower from a side in contact with the n-type semiconductor layer 11 towards a side in contact with the p-type semiconductor layer 14 due to the gradient composition of the n-type gradient composition semiconductor layer 20. More particularly, the n-type gradient composition semiconductor layer 20 is formed so that the In gradually increases and the Ga gradually decreases from the composition ratio of $In_{0.53}Ga_{0.47}As$ on the side in contact with the n-type semiconductor layer 11, such that the side in contact with the p-type semiconductor layer 14 becomes $In_{0.8}Ga_{0.2}As$. Hence, the band gap becomes narrower when the In in InGaAs increases and the Ga in InGaAs decreases. Accordingly, in the n-type gradient composition semiconductor layer 20, the band gap becomes narrower from the side in contact with the n-type semiconductor layer 11 towards the side in contact with the p-type semiconductor layer 14. The n-type semiconductor layer 11 may be formed by n-In0.53Ga0.47As.

The p-type semiconductor layer 14 is doped with an impurity element to a high concentration such that degeneracy of holes occurs. However, the n-type semiconductor layer 11 and the n-type gradient composition semiconductor layer 20 are not doped with an impurity element to a high concentration such that degeneracy of electrons occurs. In other words, the n-type semiconductor layer 11 and the n-type gradient composition semiconductor layer 20 are doped with the n-type impurity element to a relatively low concentration. Hence, the n-type semiconductor layer 11 and the n-type gradient composition semiconductor layer 20 are doped with the impurity element to a concentration lower than that of the p-type semiconductor layer 14. In this embodiment, because the n-type gradient composition semiconductor layer 20 has the gradient composition, and the anomaly in the crystal is unlikely to occur.

In this embodiment, the energy Ecn at the lower end of the conduction band of the n-type semiconductor layer 11, the energy EcnK at the lower end of the conduction band of the n-type gradient composition semiconductor layer 20, and the energy Evp at the upper end of the valence band of the p-type semiconductor layer 14 may be aligned approximately to the Fermi level Ef.

Accordingly, even when the concentration of the impurity element in the n-type gradient composition semiconductor layer 20 and the like is relatively low, the energy EcnK at the lower end of the conduction band of the n-type gradient composition semiconductor layer 20 and the like may be made approximately the same as the energy Evp at the upper end of the valence band of the p-type semiconductor layer 14. In addition, the resistance of the semiconductor device does not become high because the energy levels of the energy EcnK at the lower end of the conduction band of the n-type gradient composition semiconductor layer 20 and the like and the energy Evp at the upper end of the valence band of the p-type semiconductor layer 14 may be aligned.

The semiconductor device in this embodiment may be fabricated by performing a process of forming the n-type gradient composition semiconductor layer 20 in place of the process of forming the first and second n-type connection semiconductor layers 12 and 13 in the method of fabricating the semiconductor device of the third embodiment.

Other features and effects of this embodiment may be the same as those of the third embodiment described above.

Fifth Embodiment

Next, a description will be given of a fifth embodiment. This embodiment relates to a method of fabricating a backward diode, as a method of fabricating the semiconductor device of the third embodiment. This embodiment is different from the method of fabricating the semiconductor device of the third embodiment described above. A description will be given of the method of fabricating the semiconductor device of the third embodiment, by referring to FIGS. 19A, 19B, 20A, 20B, 21A, and 21B.

Figure 19A:
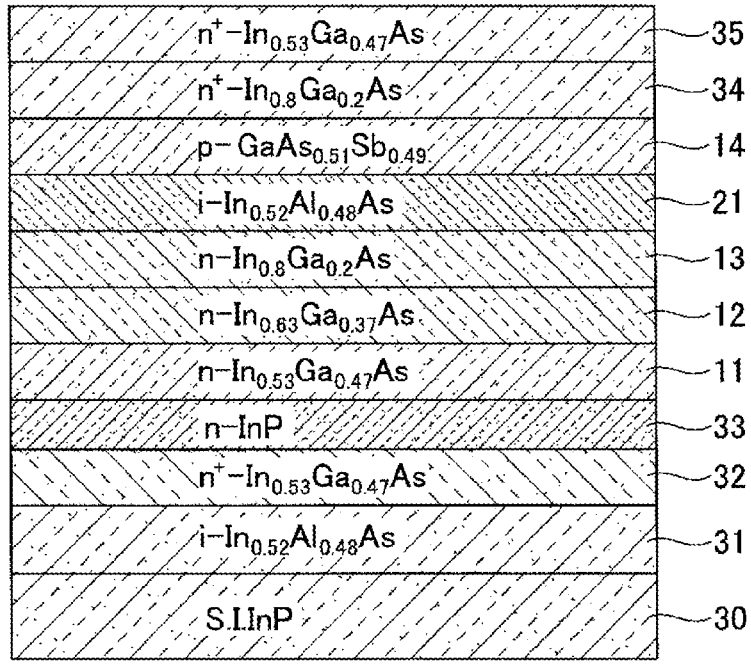
FIGS. 19A and 19B are cross sectional views for explaining a method of fabricating the semiconductor device in a fifth embodiment.

First, as illustrated in FIG. 19A, semiconductor layers are stacked on a semi-insulating InP substrate 30 by epitaxially growing each semiconductor layer by MOCVD. More particularly, a buffer layer 31, a contact layer 32, an etching stopper layer 33, an n-type semiconductor layer 11, a first n-type connection semiconductor layer 12, a second n-type connection semiconductor layer 13, a barrier layer 21, a p-type semiconductor layer 14, an n$^+$-InGaAs layer 34, and an n$^+$-InGaAs layer 35 are stacked on the InP substrate 30.

The buffer layer 31 may be formed by an i-In$_{0.52}$Al$_{0.48}$As layer having a thickness of approximately 300 nm.

The contact layer 32 may be formed by an n$^+$-In$_{0.53}$Ga$_{0.47}$As layer having a thickness of approximately 200 nm, and doped with Si as the impurity element to a concentration of $1\times10^{19}$ cm$^{-3}$.

The etching stopper layer 33 may be formed by an n-InP layer having a thickness of approximately 5 nm, and doped with Si as the impurity element to a concentration of $5\times10^{18}$ cm$^{-3}$.

The n-type semiconductor layer 11 may be formed by an n-In$_{0.53}$Ga$_{0.47}$As layer having a thickness of approximately 50 nm, and doped with Si as the impurity element to a concentration of $1\times10^{18}$ cm$^{-3}$.

The first n-type connection semiconductor layer 12 may be formed by an n-In$_{0.63}$Ga$_{0.37}$As layer having a thickness of approximately 10 nm, and doped with Si as the impurity element to a concentration of $1\times10^{18}$ cm$^{-3}$.

The second n-type connection semiconductor layer 13 may be formed by an n-In$_{0.8}$Ga$_{0.2}$As layer having a thickness of approximately 5 nm, and doped with Si as the impurity element to a concentration of $1\times10^{18}$ cm$^{-3}$.

The barrier layer 21 may be formed by an i-In$_{0.52}$Al$_{0.48}$As layer having a thickness of approximately 3 nm. The band gap of the barrier layer 21 is wider than those of the n-type semiconductor layer 11, the first n-type connection semiconductor layer 12, the second n-type connection semiconductor layer 13, and the p-type semiconductor layer 14.

The p-type semiconductor layer 14 may be formed by an p$^+$-GaAs$_{0.51}$Sb$_{0.49}$ layer having a thickness of approximately 50 nm, and doped with Zn as the impurity element to a concentration of $2\times10^{19}$ cm$^{-3}$.

The n$^+$-InGaAs layer 34 may be formed by n$^+$-In$_{0.8}$Ga$_{0.2}$As layer having a thickness of approximately 10 nm, and doped with Si as the impurity element to a concentration of $5\times10^{18}$ cm$^{-3}$.

The n$^+$-InGaAs layer 35 may be formed by n$^+$-In$_{0.53}$Ga$_{0.47}$As layer having a thickness of approximately 100 nm, and doped with Si as the impurity element to a concentration of $1\times10^{19}$ cm$^{-3}$.

The n$^+$-InGaAs layer 34 and the n$^+$-InGaAs layer 35 are formed to provide ohmic contact with the p-type semiconductor layer 14.

Figure 19B:
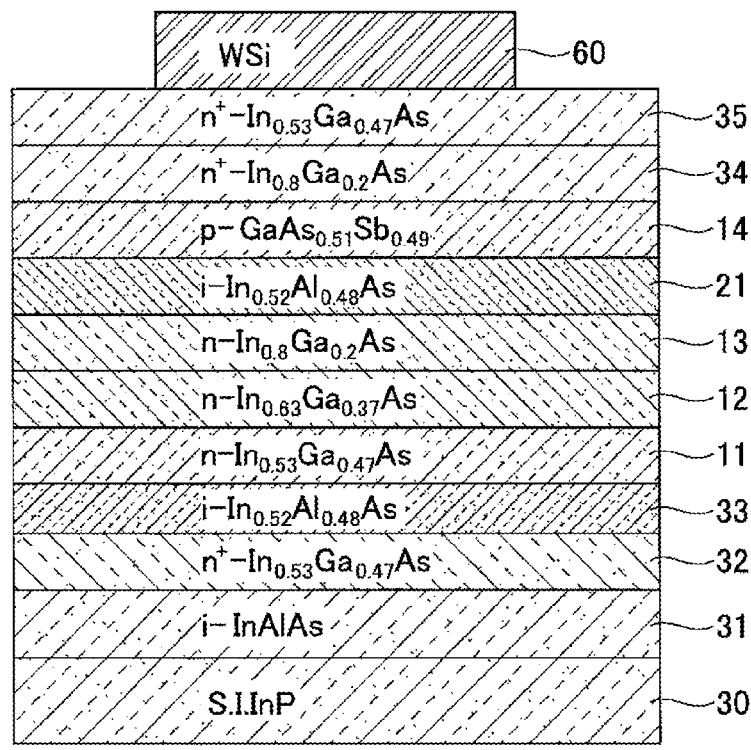

Next, as illustrated in FIG. 19B, a WSi layer 60 is formed. More particularly, a WSi layer is formed on the n$^+$-InGaAs layer 35 by sputtering, a photoresist (not illustrated) is coated on the WSi layer, and a resist pattern (not illustrated) is formed in a region where the WSi layer 60 is to be formed by exposing the photoresist by an exposure apparatus and developing the exposed photoresist. Thereafter, the WSi layer in the region where no resist pattern is formed is removed by a dry etching such as a RIE (Reactive Ion Etching) using CF$_4$ gas, SF$_6$ gas, or the like in order to form the WSi layer 60. Then, the resist pattern is removed by an organic solvent or the like.

Figure 20A:
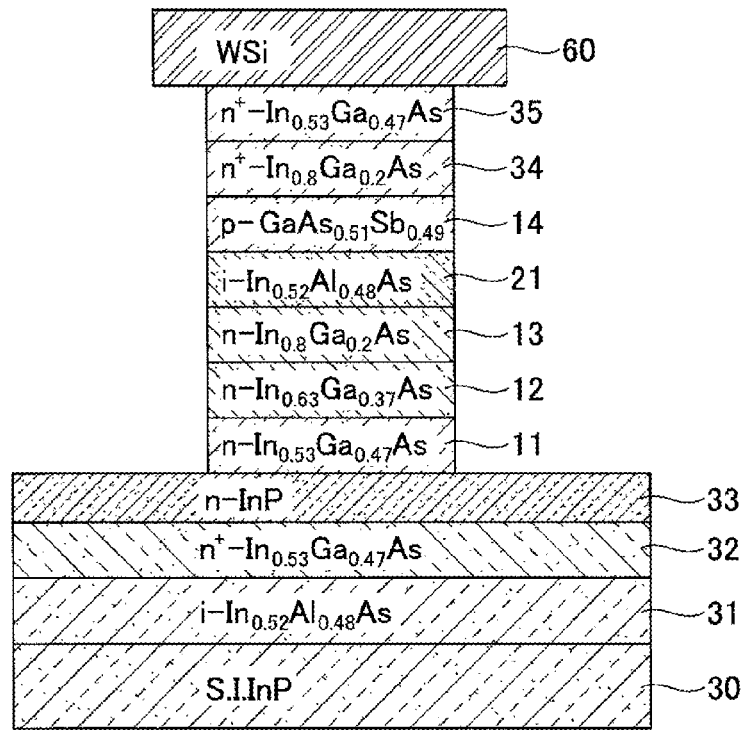
FIGS. 20A and 20B are cross sectional views for explaining the method of fabricating the semiconductor device in the fifth embodiment.

Next, as illustrated in FIG. 20A, the semiconductor layers in the region where no WSi layer 60 is formed is removed by a wet etching, in order to expose a portion of the surface of the etching stopper layer 33. More particularly, the wet etching is performed using the WSi layer 60 as a mask. Hence, a portion of the n$^+$-InGaAs layer 35, the n$^+$-InGaAs layer 34, the p-type semiconductor layer 14, the barrier layer 21, the second n-type connection semiconductor layer 13, the first n-type connection semiconductor layer 12, and the n-type semiconductor layer 11 is removed. As a result, the n$^+$-InGaAs layer 35, the n$^+$-InGaAs layer 34, the p-type semiconductor layer 14, the barrier layer 21, the second n-type connection semiconductor layer 13, the first n-type connection semiconductor layer 12, and the n-type semiconductor layer 11 are formed into a mesa shape. The wet etching may use an etchant that is a mixture of phosphoric acid and hydrogen peroxide solution, for example. In the wet etching using the etchant that is the mixture of phosphoric acid and hydrogen peroxide solution, for example, InP will not be etched, and the etching stops in a state in which the surface of the etching stopper layer 33 made of the n-InP is exposed. In this state, the etched semiconductor layers may further be subjected to a side etching by performing an over-etching for a suitable time. Consequently, side surfaces of the n$^+$-InGaAs layer 35, the n$^+$-InGaAs layer 34, the p-type semiconductor layer 14, the barrier layer 21, the second n-type connection semiconductor layer 13, the first n-type connection semiconductor layer 12, and the n-type semiconductor layer 11 may be etched.

Figure 20B:
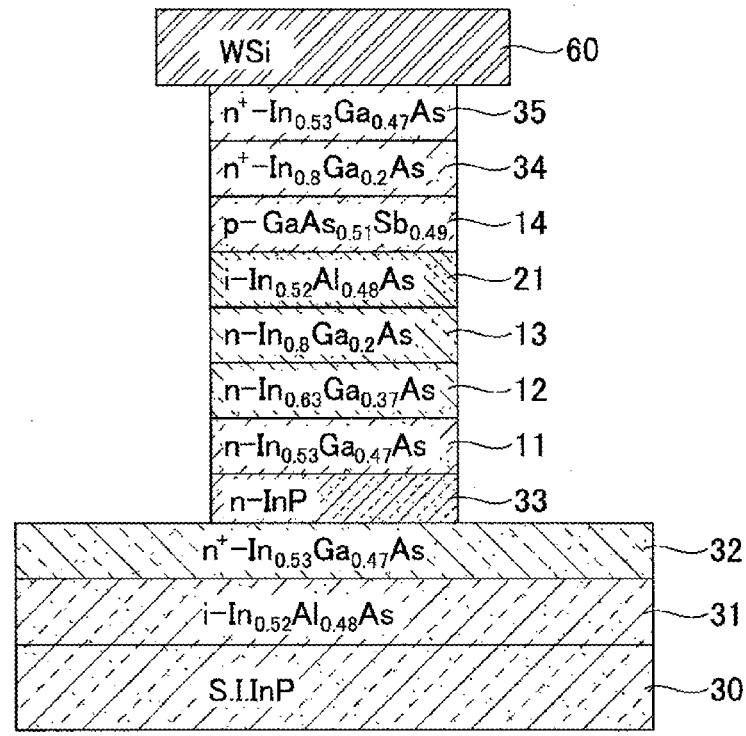

Next, as illustrated in FIG. 20B, the exposed etching stopper layer 33 is removed by a wet etching using hydrochloric acid. That is, the etching stopper layer 33 in the region where the n-type semiconductor layer 11 and the like illustrated in FIG. 20A are removed is removed. In the wet etching using hydrochloric acid, virtually no etching of the InGaAs occurs, and thus, the etching stops in a state in which the surface of the contact layer 32 made of the n$^+$-InGaAs is exposed.

Figure 21A:
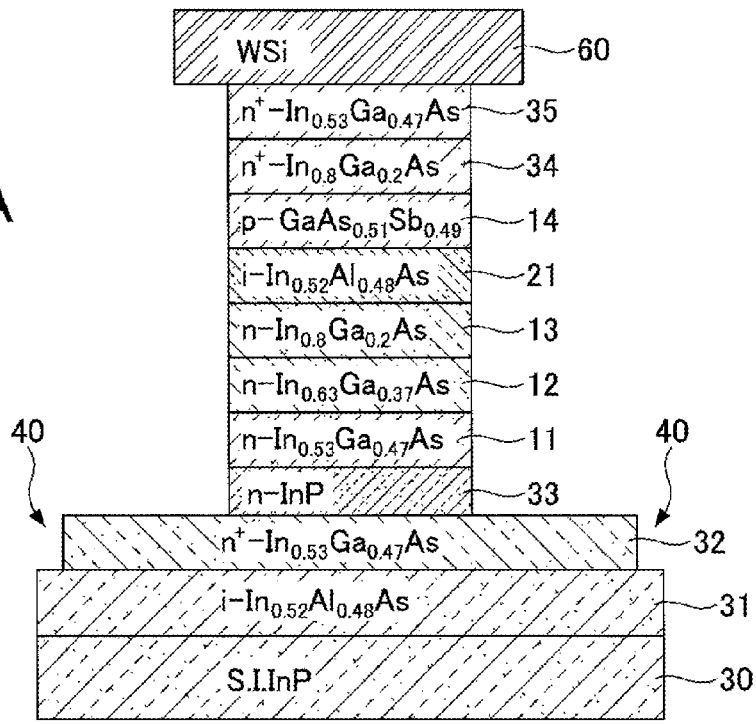
FIGS. 21A and 21B are cross sectional views for explaining the method of fabricating the semiconductor device in the fifth embodiment.

Next, as illustrated in FIG. 21A, an element isolation region 40 is formed. More particularly, a photoresist (not illustrated) is coated on the side where the surface of the semiconductor layer, such as the contact layer 32, is exposed, and a resist pattern (not illustrated) having an opening at a portion where the element isolation region 40 is to be formed is formed by exposing the photoresist by the exposure apparatus and developing the exposed photoresist. Thereafter, the contact layer 32 made of the n$^+$-InGaAs is removed by a wet etching at regions where the resist pattern is not formed, and the resist pattern is removed by an organic solvent or the like. The wet etching may use an etchant that is a mixture of phosphoric acid and hydrogen peroxide solution, for example. Hence, the element isolation region 40 may be formed by removing a portion of the contact layer 32.

Figure 21B:
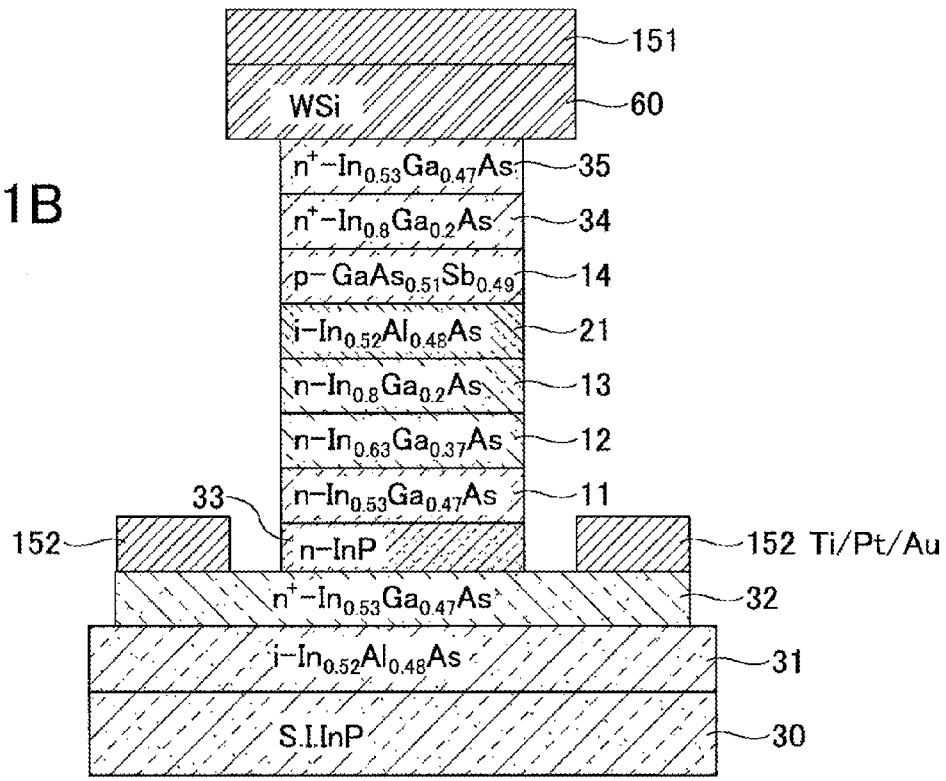

Next, as illustrated in FIG. 21B, an electrode 151 and an electrode 152 of the backward diode are formed. More particularly, a photoresist (not illustrated) is coated on the side where the surface of the semiconductor layer, such as the contact layer 32, is exposed, and a resist pattern (not illustrated) having openings at portions where the electrodes 151 and 152 are to be formed are formed by exposing the photoresist by the exposure apparatus and developing the exposed photoresist. Since the electrode 152 is formed by self-alignment, the resist pattern is not formed between the regions in which the electrodes 151 and 152 are to be formed. Thereafter, a stacked structure of metal layers, including a Ti (titanium) layer having a thickness of 10 nm, a Pt (platinum) layer having a thickness of 30 nm, and an Au (gold) layer having a thickness of 50 nm, is formed by vapor deposition, and the metal layers formed on the resist pattern are removed by a lift-off by dipping the structure into an organic solvent. Since the electrode 152 is formed by the self-alignment using the WSi layer 60, the resistance component via the contact layer 32 formed by the n⁺-InGaAs may be suppressed. Generally, when forming the electrode 152, the electrode 152 is formed by the lift-off, and it may be difficult to position the electrode 152 to the position where the electrode 152 is to be formed with a high accuracy. For this reason, it may be required to form the electrode 152 at a position that is separated by a predetermined distance by taking into consideration a margin to a certain extent. However, according to this embodiment, the electrode 152 may be formed by the self-alignment using the WSi layer 60, and the electrode 152 may be formed accurately at a certain distance from the etching stopper layer 33 or the like. Hence, the resistance component via the contact layer 32 may be set to a constant value, and the resistance component may be suppressed because it is unnecessary to take the margin into consideration.

The semiconductor device of this embodiment may be fabricated by the process described above. Other features and effects of this embodiment may be the same as those of the third embodiment described above. Further, this embodiment may also be applied to each of the first, second, and fourth embodiments described above.

Sixth Embodiment

Next, a description will be given of a sixth embodiment. This embodiment relates to a method of fabricating a part of an MMIC that includes the semiconductor device of the third embodiment. A description will be given of the method of fabricating the MMIC in which the backward diode and a HEMT (High Electron Mobility Transistor) that is an example of a field effect type semiconductor device are integrated, as the method of fabricating the semiconductor device of this embodiment, by referring to FIGS. 22A, 22B, 23A, 23B, 24A, 24B, 25A, 25B, 26A, and 26B.

Figure 22A:
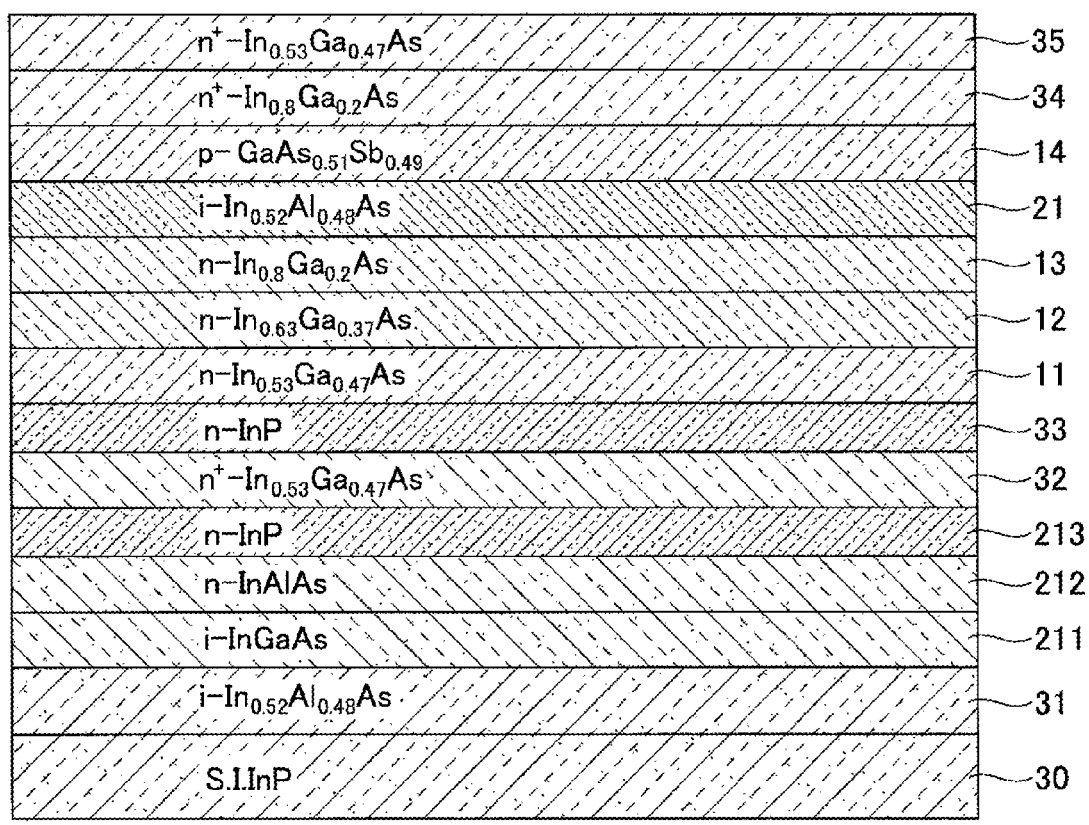
FIGS. 22A and 22B are cross sectional views for explaining a method of fabricating the semiconductor device in a sixth embodiment.

First, as illustrated in FIG. 22A, semiconductor layers are stacked on a semi-insulating InP substrate 30 by epitaxially growing each semiconductor layer by MOCVD. More particularly, a buffer layer 31, a channel layer 211, a supply layer 212, an etching stopper layer 213, a contact layer 32, an etching stopper layer 33, an n-type semiconductor layer 11, a first n-type connection semiconductor layer 12, a second n-type connection semiconductor layer 13, a barrier layer 21, a p-type semiconductor layer 14, an n⁺-InGaAs layer 34, and an n⁺-InGaAs layer 35 are stacked on the InP substrate 30.

The buffer layer 31 may be formed by an i-$In_{0.52}Al_{0.48}As$ layer having a thickness of approximately 300 nm.

The channel layer 211 may be formed by an i-$In_{0.53}Ga_{0.47}As$ layer having a thickness of approximately 15 nm.

The supply layer 212 may be formed by an n-InAlAs layer having a thickness of approximately 8 nm, and doped with an n-type impurity element, such as Si.

The etching stopper layer 213 may be formed by an n-InP layer having a thickness of approximately 5 nm, and doped with an n-type impurity element, such as Si.

The contact layer 32 may be formed by an n⁺-$In_{0.53}Ga_{0.47}As$ layer having a thickness of approximately 50 nm, and doped with Si as the impurity element to a concentration of $1 \times 10^{19}$ cm⁻³.

The etching stopper layer 33 may be formed by an n-InP layer having a thickness of approximately 5 nm, and doped with Si as the impurity element to a concentration of $5 \times 10^{18}$ cm⁻³.

The n-type semiconductor layer 11 may be formed by an n-$In_{0.53}Ga_{0.47}As$ layer having a thickness of approximately 50 nm, and doped with Si as the impurity element to a concentration of $1 \times 10^{18}$ cm⁻³.

The first n-type connection semiconductor layer 12 may be formed by an n-$In_{0.63}Ga_{0.37}As$ layer having a thickness of approximately 10 nm, and doped with Si as the impurity element to a concentration of $1 \times 10^{18}$ cm⁻³.

The second n-type connection semiconductor layer 13 may be formed by an n-$In_{0.8}Ga_{0.2}As$ layer having a thickness of approximately 5 nm, and doped with Si as the impurity element to a concentration of $1 \times 10^{18}$ cm⁻³.

The barrier layer 21 may be formed by an i-$In_{0.52}Al_{0.48}As$ layer having a thickness of approximately 3 nm. The band gap of the barrier layer 21 is wider than those of the n-type semiconductor layer 11, the first n-type connection semiconductor layer 12, the second n-type connection semiconductor layer 13, and the p-type semiconductor layer 14.

The p-type semiconductor layer 14 may be formed by an p⁺-$GaAs_{0.51}Sb_{0.49}$ layer having a thickness of approximately 50 nm, and doped with Zn as the impurity element to a concentration of $2 \times 10^{19}$ cm⁻³.

The n⁺-InGaAs layer 34 may be formed by n⁺-$In_{0.8}Ga_{0.2}As$ layer having a thickness of approximately 10 nm, and doped with Si as the impurity element to a concentration of $5 \times 10^{18}$ cm⁻³.

The n⁺-InGaAs layer 35 may be formed by n⁺-$In_{0.53}Ga_{0.47}As$ layer having a thickness of approximately 100 nm, and doped with Si as the impurity element to a concentration of $1 \times 10^{19}$ cm⁻³.

Amongst the semiconductor layers formed on the InP substrate 30, the channel layer 211, the supply layer 212, the etching stopper layer 213, and the contact layer 32 are the semiconductor layers forming the HEMT. In addition, the contact layer 32, the etching stopper layer 33, the n-type semiconductor layer 11, the first n-type connection semiconductor layer 12, the second n-type connection semiconductor layer 13, the barrier layer 21, the p-type semiconductor layer 14, the n⁺-InGaAs layer 34, and the n⁺-InGaAs layer 35 are the semiconductor layers forming the backward diode.

Figure 22B:
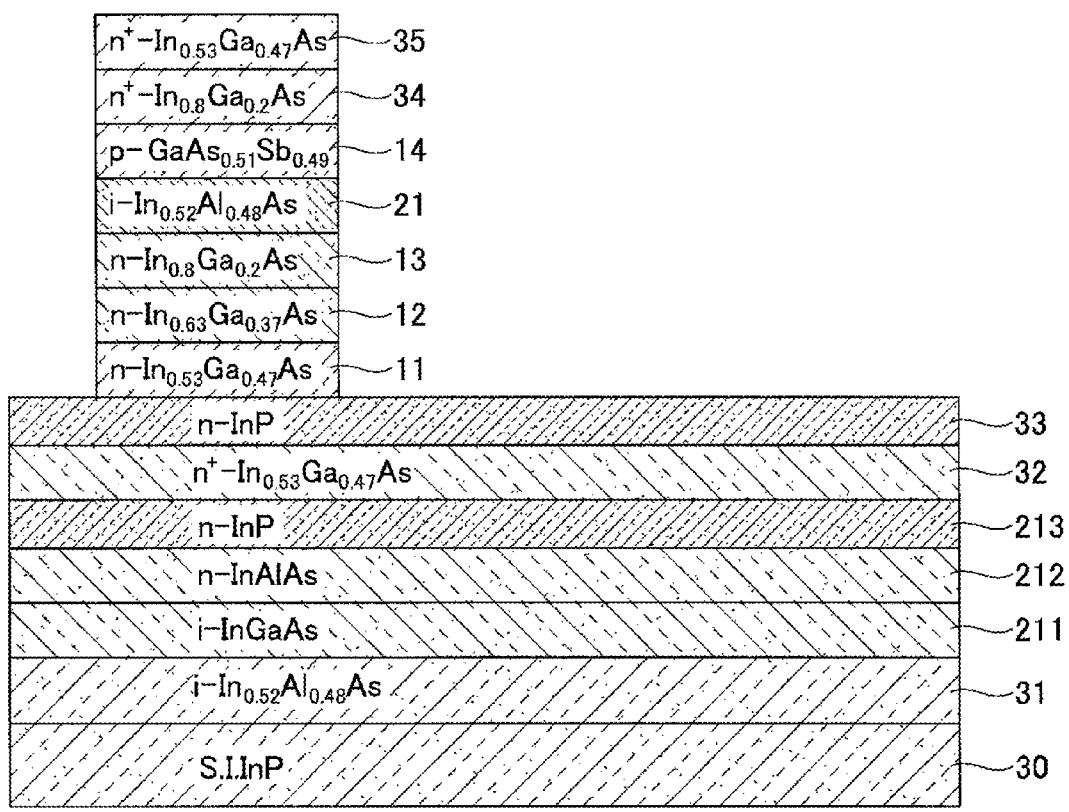

Next, as illustrated in FIG. 22B, a wet etching is performed until a portion of the surface of the etching stopper layer 33 becomes exposed. More particularly, a photoresist (not illustrated) is coated on the surface of the n⁺-InGaAs layer 35, and a photoresist pattern (not illustrated) is formed by exposing the photoresist by an exposure apparatus and developing the exposed photoresist. Thereafter, this resist pattern is used as a mask when performing the wet etching. Hence, a portion of the n⁺-InGaAs layer 35, n⁺-InGaAs layer 34, the p-type semiconductor layer 14, the barrier layer 21, the second n-type connection semiconductor layer 13, the first n-type connection semiconductor layer 12, and the n-type semiconductor layer 11 is removed.

The wet etching may use an etchant that is a mixture of phosphoric acid and hydrogen peroxide solution, for example. Since InP will not be etched by this etchant, the etching stops in a state in which the surface of the etching stopper layer 33 made of the n-InP is exposed. Hence, the n⁺-InGaAs layer 35, n⁺-InGaAs layer 34, the p-type semiconductor layer 14, the barrier layer 21, the second n-type connection semiconductor layer 13, the first n-type connection semiconductor layer 12, and the n-type semiconductor layer 11 may be formed to a mesa shape.

Figure 23A:
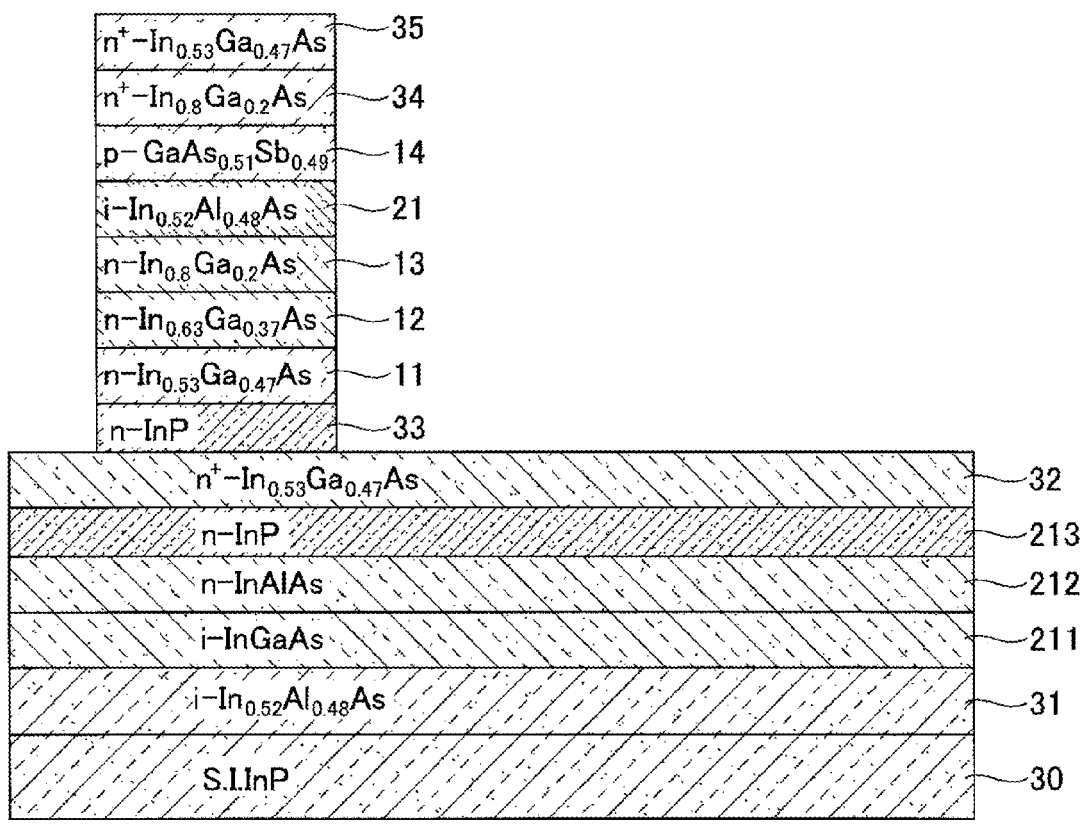
FIGS. 23A and 23B are cross sectional views for explaining the method of fabricating the semiconductor device in the sixth embodiment.

Next, as illustrated in FIG. 23A, the exposed etching stopper layer 33 is removed by a wet etching using hydrochloric acid. That is, the etching stopper layer 33 made of the n-InP in the region where the n-type semiconductor layer 11 and the like illustrated in FIG. 22B are removed is removed. In the wet etching using hydrochloric acid, virtually no etching of the InGaAs occurs, and thus, the etching stops in a state in which the surface of the contact layer 32 made of the n$^+$-InGaAs is exposed.

Figure 23B:
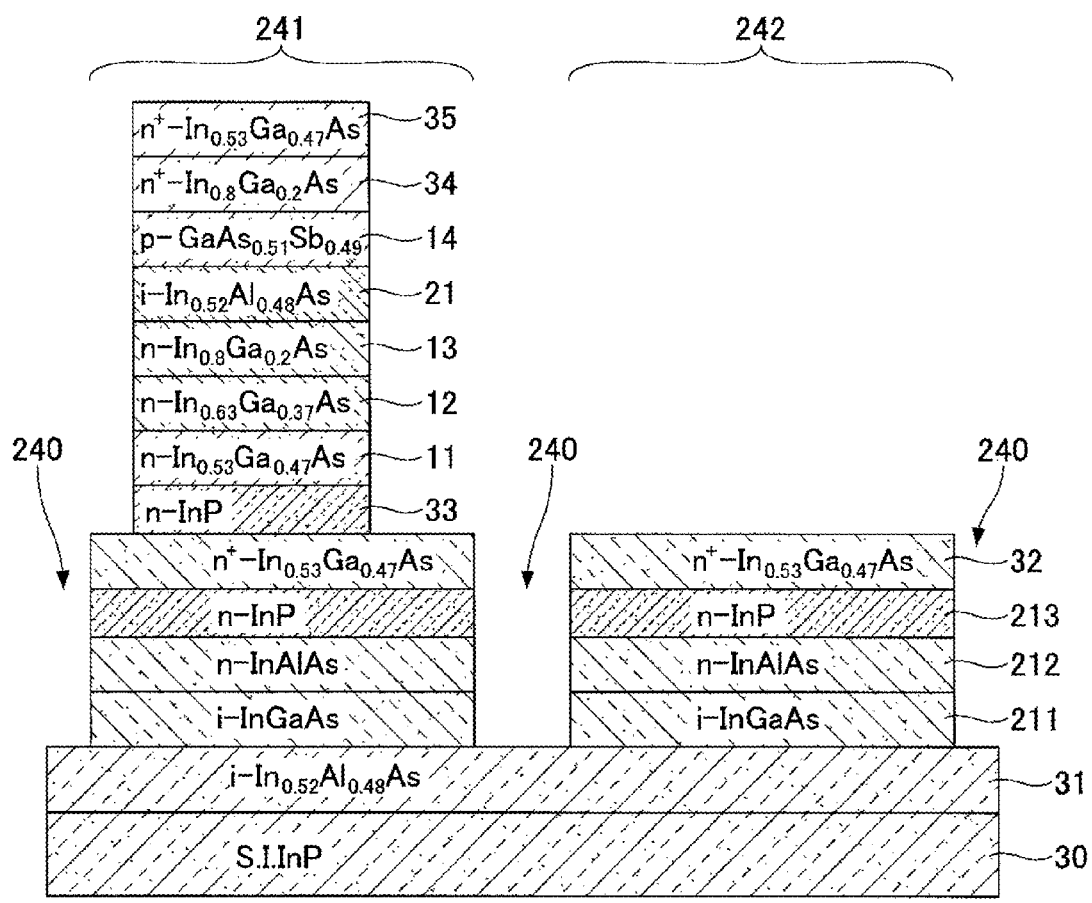

Next, as illustrated in FIG. 23B, an element isolation region 240 is formed. More particularly, a photoresist (not illustrated) is coated on the contact layer 32 that is exposed, and a resist pattern (not illustrated) having an opening at a portion where the element isolation region 240 is to be formed is formed by exposing the photoresist by the exposure apparatus and developing the exposed photoresist. Thereafter, the channel layer 211, the supply layer 212, the etching stopper layer 213, and the contact layer 32 are removed by a wet etching at regions where the resist pattern is not formed, and the resist pattern is removed by an organic solvent or the like. The wet etching may use an etchant that is a mixture of phosphoric acid and hydrogen peroxide solution, for example, when etching the channel layer 211, the supply layer 212, and the contact layer 32. In addition, the wet etching may use hydrochloric acid as the etchant, for example, when etching the etching stopper layer 213. Hence, the element isolation region 240 may be formed, and the element isolation of the backward diode and the element isolation of the HEMT may be formed simultaneously. Thereafter, the resist pattern is removed. A backward diode region 241 and a HEMT region 242 are formed by forming the element isolation region 240.

Figure 24A:
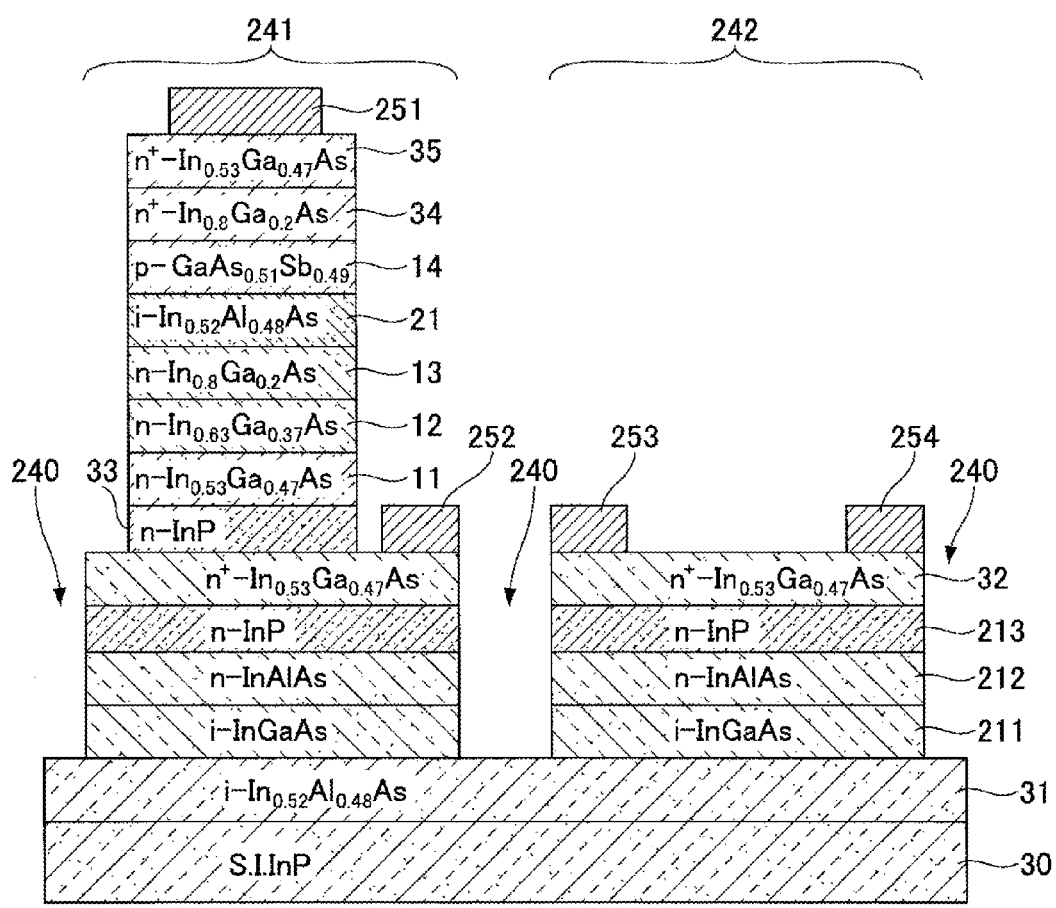
FIGS. 24A and 24B are cross sectional views for explaining the method of fabricating the semiconductor device in the sixth embodiment.

Next, as illustrated in FIG. 24A, a diode electrode 251 and another diode electrode 252 of the backward diode are formed, and a source electrode 253 and a drain electrode 254 of the HEMT are formed. More particularly, a photoresist (not illustrated) is coated on the side where the surface of the contact layer 32 is exposed, and a resist pattern (not illustrated) having openings at portions where the diode electrodes 251 and 252, the source electrode 253, and the drain electrode 254 are to be formed are formed by exposing the photoresist by the exposure apparatus and developing the exposed photoresist. Thereafter, a stacked structure of metal layers, including a Ti (titanium) layer having a thickness of 10 nm, a Pt (platinum) layer having a thickness of 30 nm, and an Au (gold) layer having a thickness of 300 nm, is formed by vapor deposition, and the metal layers formed on the resist pattern are removed by a lift-off by dipping the structure into an organic solvent. As a result, the diode electrodes 251 and 252 of the backward diode and the source electrode 253 and the drain electrode 254 of the HEMT are formed simultaneously.

Figure 24B:
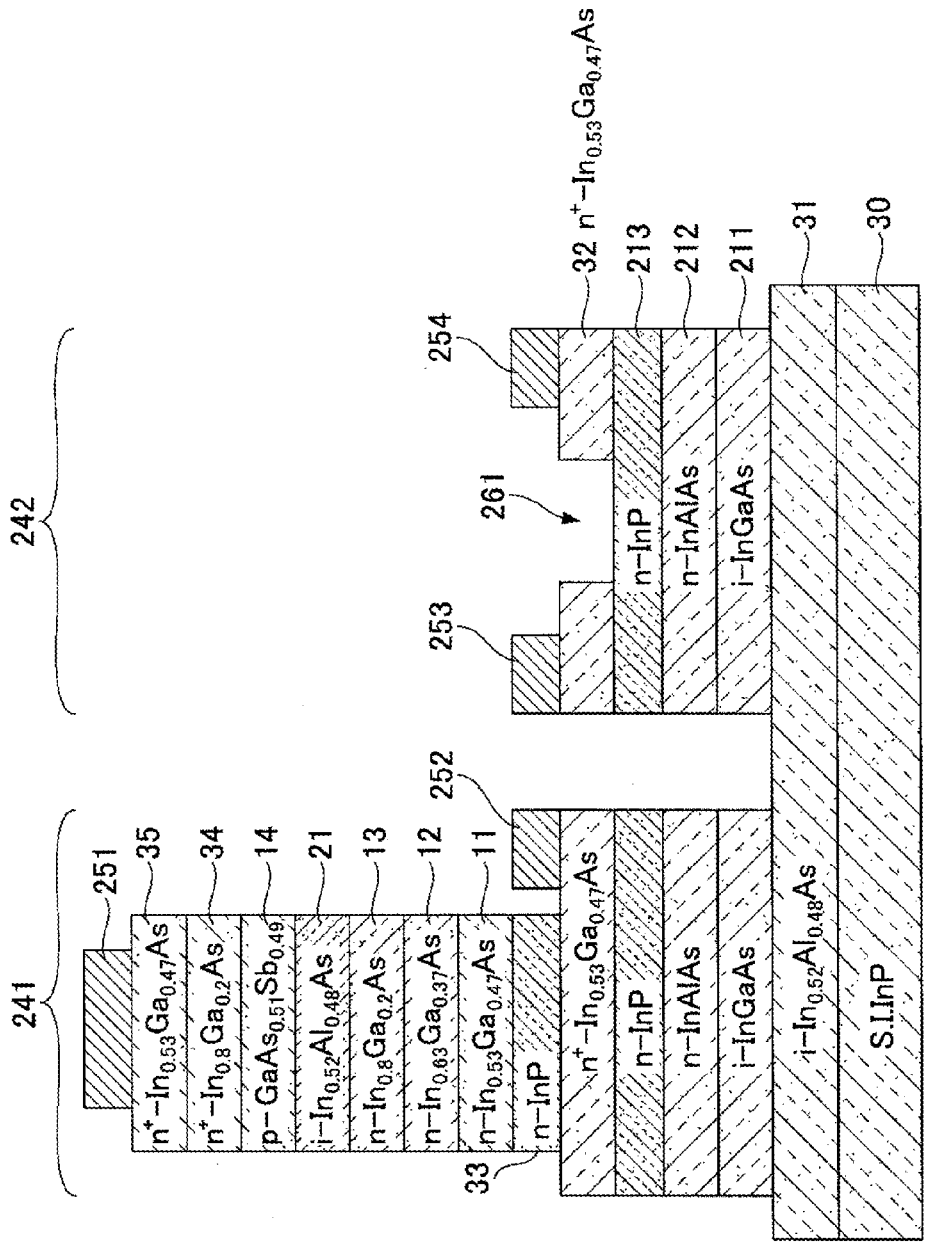

Next, as illustrated in FIG. 24B, a recess part 261 is formed by removing a portion of the contact layer 32. More particularly, a resist (not illustrated) to be exposed to an electron beam is coated on the side where the surface of the contact layer 32 is exposed, and a resist pattern (not illustrated) having an opening in a region where the recess part 261 is to be formed is formed by an electron beam exposure apparatus such as an electron beam lithography apparatus. Thereafter, the contact layer 32 in the region where no resist pattern is formed is removed by a wet etching using an etchant that is a mixture of citric acid and hydrogen peroxide solution. Because the InP will not be etched by this etchant, the etching stops in a state in which the surface of the etching stopper layer 213 made of the i-InP is exposed. Then, the resist pattern is removed by an organic solvent or the like.

Next, as illustrated in FIG. 25A, a gate electrode 255 is formed in the recess part 261 in the HEMT region 242. More particularly, the resist (not illustrated) to be exposed to the electron beam is coated on the side formed with the recess part 261, and a resist pattern (not illustrated) having an opening in a region where the gate electrode 255 is to be formed is formed by the electron beam exposure apparatus such as the electron beam lithography apparatus. Thereafter, a stacked structure of metal layers, including a Ti (titanium) layer having a thickness of 10 nm, a Pt (platinum) layer having a thickness of 30 nm, and an Au (gold) layer having a thickness of 500 nm, is formed by vapor deposition, and the metal layers formed on the resist pattern are removed by a lift-off by dipping the structure into an organic solvent. As a result, the gate electrode 255 of the HEMT is formed.

Figure 25B:
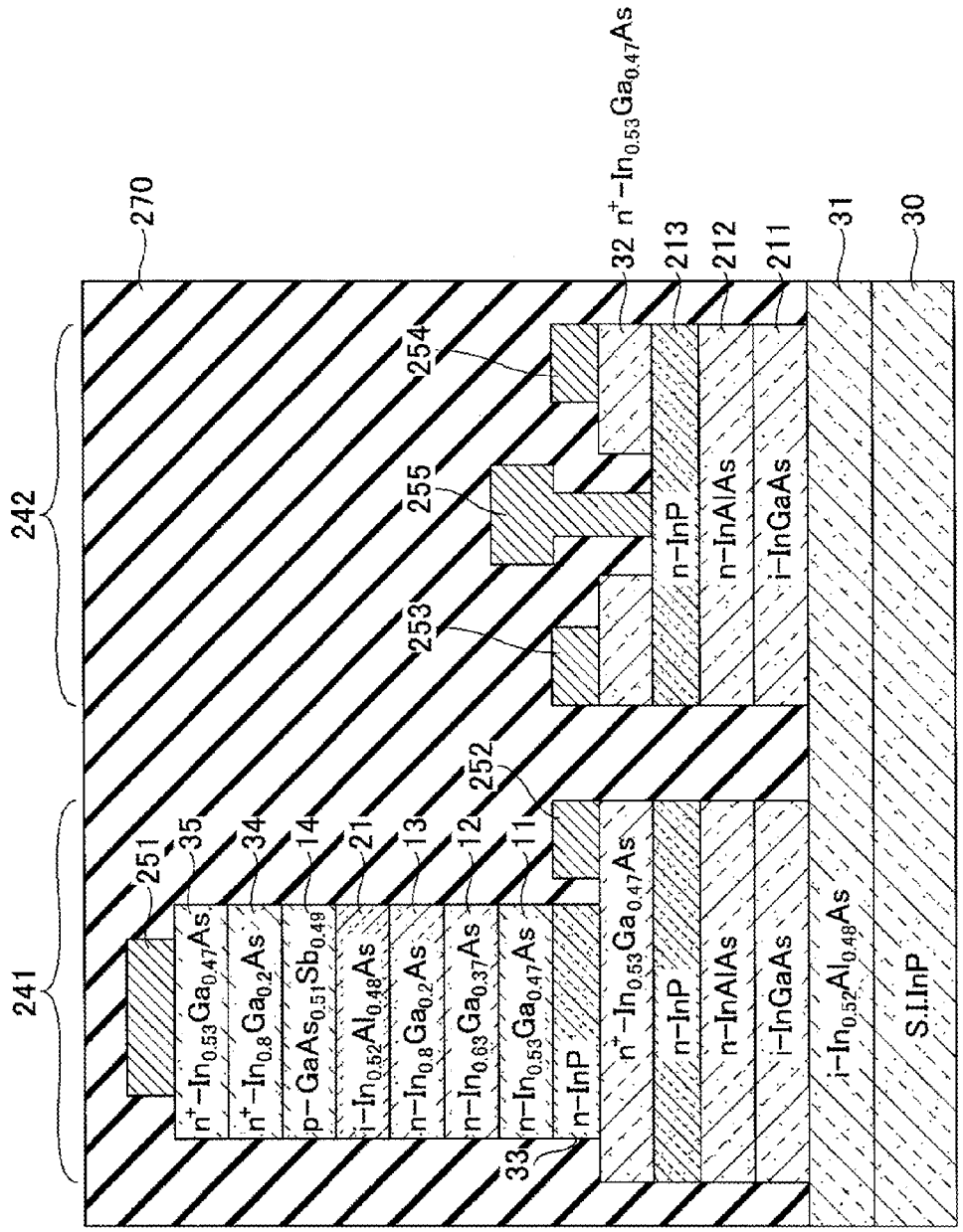

Next, as illustrated in FIG. 25B, an interlayer insulator layer 270 is formed on the side formed with the diode electrodes 251 and 252 of the backward diode and the source and drain electrodes 253 and 254 of the HEMT. This interlayer insulator layer 270 may be formed by BCB (Bmenzocyclobutene) or polyimide.

Next, as illustrated in FIG. 26A, a portion of the interlayer insulator layer 270 on the diode electrodes 251 and 252 and the source and drain electrodes 253 and 254 is removed, in order to form contact holes 271, 272, 273, and 274. More particularly, a photoresist (not illustrated) is coated on the surface of the interlayer insulator layer 270, and a resist pattern (not illustrated) having openings at portions where the contact holes 271, 272, 273, and 274 are to be formed is formed by exposing the photoresist by the exposure apparatus and developing the exposed photoresist. Thereafter, the resist pattern is used as a mask, and a dry etching is performed until surfaces of the diode electrodes 251 and 252 and the source and drain electrodes 253 and 254 are exposed. As a result, the contact holes 271, 272, 273, and 274 are formed.

Figure 26B:
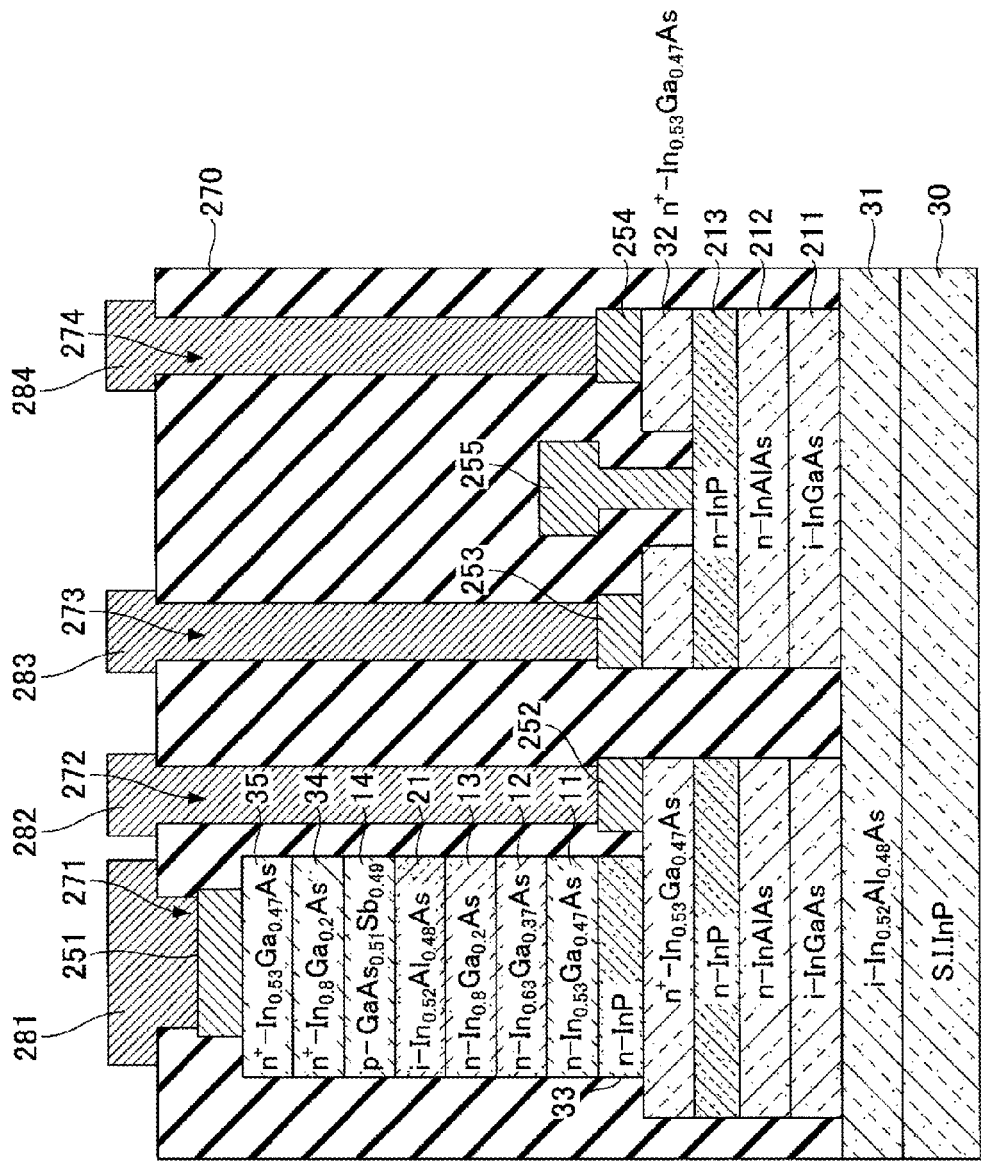

Next, as illustrated in FIG. 26B, wiring electrodes 281, 282, 283, and 284 are formed in the contact holes 271, 272, 273, and 274 by plating Au or the like. More particularly, the wiring electrodes 281, 282, 283, and 284 electrically connecting to the diode electrodes 251 and 252 of the backward diode and the source and drain electrodes 253 and 254 of the HEMT, respectively, are formed. Thereafter, the wiring electrode 281 connected to the diode electrode 251, and the wiring electrode 283 connected to the source electrode 253, are grounded. In addition, the wiring electrode 282 connected to the diode electrode 252, and the wiring electrode 284 connected to the drain electrode 254, are connected to an output terminal.

Accordingly, it is possible to fabricate the MMIC in which the backward diode and the HEMT are integrated, where the backward diode is an example of the semiconductor device of this embodiment. Other features and effects of this embodiment may be the same as those of the third embodiment described above. In addition, this embodiment may use the semiconductor device of any of the first, second, and fourth embodiments described above in place of the semiconductor device of the third embodiment.

Although the embodiments are numbered with, for example, "first," "second," "third," "fourth," "fifth," or "sixth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a first semiconductor layer of a first conductivity type;
   a second semiconductor layer of a second conductivity type; and
   a third semiconductor layer and a fourth semiconductor layer of the first conductivity type, respectively, formed between the first semiconductor layer and the second semiconductor layer,
   wherein the first semiconductor layer, the third semiconductor layer, the fourth semiconductor layer, and the second semiconductor layer are coupled in this order,
   wherein a band gap of the third semiconductor layer is narrower than that of the first semiconductor layer,
   wherein a band gap of the fourth semiconductor layer is narrower than that of the third semiconductor layer, and
   wherein an energy Ecn at a lower end of a conduction band of the first semiconductor layer, an energy Ecn1 at a lower end of a conduction band of the third semiconductor layer, an energy Ecn2 at a lower end of a conduction band of the fourth semiconductor layer, and an energy Evp at an upper end of a valence band of the second semiconductor layer are aligned approximately to a Fermi level Ef.

2. The semiconductor device as claimed in claim 1, further comprising:
   a semiconductor substrate, wherein
   the first semiconductor layer is formed on the semiconductor substrate,
   the third semiconductor layer is formed on the first semiconductor layer,
   the fourth semiconductor layer is formed on the third semiconductor layer, and
   the second semiconductor layer is formed on the fourth semiconductor layer.

3. The semiconductor device as claimed in claim 1, further comprising:
   a barrier layer, formed between the second semiconductor layer and the fourth semiconductor layer, and having a band gap wider than those of the first semiconductor layer and the second semiconductor layer.

4. The semiconductor device as claimed in claim 3, wherein the barrier layer is made of InAlAs.

5. The semiconductor device as claimed in claim 1, wherein the first semiconductor layer includes InGaAs.

6. The semiconductor device as claimed in claim 1, wherein
   the third semiconductor layer and the fourth semiconductor layer include InGaAs,
   a composition ratio of In included in the third semiconductor layer is larger than that included in the first semiconductor layer, and
   a composition ratio of In included in the fourth semiconductor layer is larger than that included in the third semiconductor layer.

7. The semiconductor device as claimed in claim 1, wherein concentrations of an impurity element in the third semiconductor layer and the fourth semiconductor layer are lower than that in the second semiconductor layer.

8. The semiconductor device as claimed in claim 1, wherein the first conductivity type is an n-type, and the second conductivity type is a p-type.

9. The semiconductor device as claimed in claim 1, wherein the second semiconductor layer includes GaAsSb.

10. The semiconductor device as claimed in claim 1, further comprising:
    a semiconductor substrate, wherein the first semiconductor layer and the second semiconductor layer are formed on the semiconductor substrate, and
    a field effect type semiconductor device formed on the semiconductor substrate.

11. A semiconductor device comprising:
    a first semiconductor layer of a first conductivity type;
    a second semiconductor layer of a second conductivity type; and
    a gradient composition semiconductor layer of the first conductivity type formed between the first semiconductor layer and the second semiconductor layer,
    wherein the first semiconductor layer, the gradient composition semiconductor layer, and the second semiconductor layer are coupled in this order,
    wherein a band gap of the gradient composition semiconductor layer is equal to or narrower than that of the first semiconductor layer, and gradually becomes narrower from a side provided with the first semiconductor layer towards a side provided with the second semiconductor layer, and
    wherein an energy Ecn at a lower end of a conduction band of the first semiconductor layer, an energy EcnK at a lower end of a conduction band of the gradient composition semiconductor layer, and an energy Evp at an upper end of a valence band of the second semiconductor layer are aligned approximately to a Fermi level Ef.

12. The semiconductor device as claimed in claim 11, further comprising:
    a semiconductor substrate,
    wherein the first semiconductor layer is formed on the semiconductor substrate,
    the gradient composition semiconductor layer is formed on the first semiconductor layer, and
    the second semiconductor layer is formed on the gradient composition semiconductor layer.

13. The semiconductor device as claimed in claim 11, further comprising:
    a barrier layer, formed between the second semiconductor layer and the gradient composition semiconductor layer, and having a band gap wider than those of the first semiconductor layer and the second semiconductor layer.

14. The semiconductor device as claimed in claim 13, wherein the barrier layer is made of InAlAs.

15. The semiconductor device as claimed in claim 11, wherein the first semiconductor layer includes InGaAs.

16. The semiconductor device as claimed in claim 11, wherein
    the gradient composition semiconductor layer includes InGaAs, and
    a composition ratio of In included in the gradient composition semiconductor layer gradually increases from the side provided with the first semiconductor layer towards the side provided with the second semiconductor layer.

17. The semiconductor device as claimed in claim 11, wherein concentrations of an impurity element in the gradient composition semiconductor layer is lower than that in the second semiconductor layer.

18. A semiconductor device comprising:
    a first semiconductor layer of a first conductivity type;
    a second semiconductor layer of a second conductivity type; and a plurality of semiconductor layers of the first conductivity type formed between the first semiconductor layer and the second semiconductor layer, wherein the first semiconductor layer, the plurality of semiconductor layers, and the second semiconductor layer are coupled in this order, wherein a band gap of the plurality of semiconductor layers is narrower than that of the first semiconductor layer, wherein the band gap gradually becomes narrower from one of the plurality of semiconductor layers provided on a side of the first semiconductor layer towards another of the plurality of semiconductor layers provided on a side of the second semiconductor layer, wherein an energy $Ecn$ at a lower end of a conduction band of the first semiconductor layer, an energy $Ecn1$ at a lower end of a conduction band of the one of the plurality of semiconductor layers, an energy $Ecn2$ at a lower end of a conduction band of the other of the plurality of semiconductor layers are aligned approximately to a single energy level, and an energy $Evp$ at an upper end of a valence band of the second semiconductor layer are aligned approximately to a Fermi level $Ef$.

19. The semiconductor device as claimed in claim 18, further comprising:
a barrier layer, formed between the second semiconductor layer and the plurality of semiconductor layers, and having a band gap wider than those of the first semiconductor layer and the second semiconductor layer.

20. The semiconductor device as claimed in claim 18, wherein
the plurality of semiconductor layers include InGaAs, and
a composition ratio of In gradually increases from the one of the plurality of semiconductor layers provided on the side of the first semiconductor layer towards the other of the plurality of semiconductor layers provided on the side of the second semiconductor layer.

* * * * *